(12) United States Patent
Zhu et al.

(10) Patent No.: US 11,329,239 B2
(45) Date of Patent: May 10, 2022

(54) MULTI-MODE PHOTODETECTORS AND METHODS OF FABRICATING THE SAME

(71) Applicant: Hong Kong Baptist University, Hong Kong (HK)

(72) Inventors: Furong Zhu, Hong Kong (HK); Zhaojue Lan, Hong Kong (HK)

(73) Assignee: Hong Kong Baptist University, Hong Kong (HK)

( * ) Notice: Subject to any disclaimer, the term of this patent is extended or adjusted under 35 U.S.C. 154(b) by 287 days.

(21) Appl. No.: 16/592,793

(22) Filed: Oct. 4, 2019

(65) Prior Publication Data
US 2020/0111980 A1  Apr. 9, 2020

Related U.S. Application Data

(60) Provisional application No. 62/743,525, filed on Oct. 9, 2018.

(51) Int. Cl.
*H01L 51/46* (2006.01)
*H01L 51/42* (2006.01)
*H01L 51/00* (2006.01)

(52) U.S. Cl.
CPC .......... *H01L 51/42* (2013.01); *H01L 51/0036* (2013.01); *H01L 51/0047* (2013.01); *H01L 51/0053* (2013.01)

(58) Field of Classification Search
CPC ... Y02E 10/549; Y02E 10/52; H01L 51/4246; H01L 51/447; H01L 51/0001;
(Continued)

(56) References Cited

U.S. PATENT DOCUMENTS 5,914,976 A * 6/1999 Jayaraman ............ H01S 5/0262
372/50.21
7,326,908 B2 * 2/2008 Sargent .................. B82Y 10/00
250/214.1
(Continued)

FOREIGN PATENT DOCUMENTS

JP  2000188407 A   7/2000
JP  2008028002 A   2/2008
(Continued)

OTHER PUBLICATIONS

Office Action issued in corresponding Japan Invention patent application No. 2019-185194 dated Jan. 6, 2021.

*Primary Examiner* — Mary A Wilczewski
*Assistant Examiner* — Tsz K Chiu
(74) *Attorney, Agent, or Firm* — Idea Intellectual Limited; Margaret A. Burke; Sam T. Yip

(57) ABSTRACT

The present invention relates to a bias-switchable spectral response high performance PD with multi-mode detection, e.g., dual-mode photoresponses in NIR and visible light ranges. The dual-mode PD has the absorber/spacer type components in its active layer, e.g., a tri-layer configuration of absorber-1 (absorber-1 absorbs the electromagnetic wave of the first wavelength comprising visible light)/optical spacer/absorber-2 (absorber-2 absorbs the electromagnetic wave of the second wavelength comprising IR light). In the presence of IR light, photocurrent generates in the IR light absorbing layer under a reverse bias. In the presence of visible light, photocurrent generates in the visible light absorbing layer under a forward bias. A bias-switchable spectral response PD offers an attractive option for applications in environmental pollution, bio, medical, agricultural, automotive, fishery, food, wellness and security monitoring, detection and imaging in two or different or multiple distinct bands.

18 Claims, 18 Drawing Sheets

(58) Field of Classification Search
CPC . H01L 51/42; H01L 51/0047; H01L 51/0036; H01L 51/4213; H01L 51/428; H01L 51/0053; H01L 51/0081; H01L 51/0504; H01L 27/3227; H01L 27/288; H01L 27/307; Y02P 70/50
See application file for complete search history.

(56) References Cited

U.S. PATENT DOCUMENTS

| | | | |
|---|---|---|---|
| 2006/0076050 A1* | 4/2006 | Williams | H01L 51/424 136/263 |
| 2006/0278869 A1* | 12/2006 | Hioki | H01L 27/14647 257/40 |
| 2007/0215868 A1* | 9/2007 | Forrest | B82Y 10/00 257/40 |
| 2009/0301565 A1* | 12/2009 | Curran | H01L 51/4253 136/263 |
| 2013/0022077 A1 | 1/2013 | Harmon et al. | |
| 2016/0087001 A1 | 3/2016 | Tennant et al. | |
| 2021/0066384 A1* | 3/2021 | Greco | H01L 27/1467 |

FOREIGN PATENT DOCUMENTS

| | | | |
|---|---|---|---|
| JP | 2014522117 A | 8/2014 | |
| JP | 2018524820 A | 8/2018 | |
| WO | 2017178905 A1 | 10/2017 | |

* cited by examiner

MULTI-MODE PHOTODETECTORS AND METHODS OF FABRICATING THE SAME

CROSS REFERENCE OF RELATED APPLICATION

This application is a non-provisional application, which claims priority to U.S. Provisional Patent Application Ser. No. 62/743,525 filed on Oct. 9, 2018, which is hereby incorporated by reference in its entirety.

FIELD OF THE INVENTION

The present invention relates to an absorber/spacer type bias-switchable spectral response high performance multi-mode photodetector (PD). In this invention, a multi-mode PD comprises the absorber/spacer or spacer/absorber or absorber-1/spacer/absorber-2 or spacer-1/absorber/spacer-2 component and/or their combinations. Absorber and spacer materials used in the absorber/spacer type multi-mode PDs may be made from the same or different functional materials, e.g., a dual-mode PD, comprising a stack of absorber-1 (absorber-1 absorbs the electromagnetic wave of the first wavelength comprising visible light)/optical spacer/absorber-2 (absorber-2 absorbs the electromagnetic wave of the second wavelength comprising IR light), is designed. A bias-switchable spectral response multi-mode PD can be used for applications in environmental pollution, bio, medical, agricultural, automotive, fishery, food, wellness and security monitoring, detection and imaging in two or different or multiple distinct bands. Methods for fabrication of the multi-mode PD are also provided.

BACKGROUND OF THE INVENTION

Photodetectors (PDs), prepared by organic, polymer, perovskite, colloidal quantum dots, organic/inorganic hybrids, 1D and 2D low dimensional materials and their combinations, are a promising alternative optical detecting technology to conventional wafer-based inorganic counterparts, because the optical and electric properties of these functional materials can be tailored accordingly. They offer additional advantages such as having a solution-processable fabrication process, which also leads to significant cost benefits, thereby creating next-generation solution-processable, flexible and low-cost photodetectors. In general, the spectral responses of the photodetectors are determined by the absorption of the active materials and optical profile in the devices. Discrete PDs using solution-processable organic, polymer, perovskite, colloidal quantum dots, organic/inorganic hybrids, 1D and 2D low dimensional materials and their combinations with different optical bandgaps for X-ray and ultraviolet (UV), visible light, near-infrared (NIR), short wavelength infrared (SWIR), middle wavelength infrared (MWIR), long wavelength infrared (LWIR) and very long wavelength infrared (VLWIR) detections have been reported. These achievements, however, are made with the single-mode PDs optimized for photodetection at the specific spectral ranges. The progresses made in dual-mode or multi-mode PDs that possess simultaneous photoresponses to different wavelength ranges are less impressive.

Realizing spectral tunable PDs with high detectivity in two distinct or different or multiple bands, particularly over the wavelength range from infrared (IR) and visible light, are very attractive for a plethora of applications in environmental pollution, bio, medical, agricultural, automotive, fishery, food, wellness and security monitoring, detection and imaging in two or different or multiple distinct bands. However, the reports on spectral tunable PDs are rather rare. A UV PD that had detection in two peak spectral responses at 365 nm and 330 nm was observed when its transparent indium tin oxide (ITO) front electrode and the semitransparent Al (15 nm)/Ag (100 nm) rear electrode were exposed to the incident light. This is due to the respective absorption behaviors of the donor and acceptor in the bilayer planar donor/acceptor heterojunction. Different spectral responses, e.g., exhibiting broadband and narrowband characteristics, were also observed in a thick perovskite photodetector when its top side or bottom side was exposed to the incident light. Spectral tunable PDs that can be operated without flipping the detectors are of practical interests.

Dual-mode PDs with a unique tunable photodetection capability, particularly over the IR and visible light wavelength ranges, that can be operated by adjusting the polarity of the biases are still an open challenge.

In this invention, the inventors report their efforts to develop a dual-mode PD that has a unique feature of high IR light response, operated under a reverse bias, and visible light response, operated under a forward bias, taking advantage of photo-multiplication effect. The dual-mode PD has a novel absorber/spacer-based photoactive structure, e.g., a tri-layer absorber-1/spacer/absorber-2, comprising a layer configuration of substrate/front electrode/absorber-1 (absorber-1 absorbs the electromagnetic wave of the first wavelength comprising visible light)/optical spacer/absorber-2 (absorber-2 absorbs the electromagnetic wave of the second wavelength comprising IR light)/rear electrode. The unique dual-mode PD with tunable responses over a broad spectral range from visible to IR light offers an attractive option for applications in environmental pollution, bio, medical, agricultural, automotive, fishery, food, wellness and security monitoring, detection and imaging in two or different or multiple distinct bands.

SUMMARY OF THE INVENTION

Accordingly, a first aspect of this invention relates to a high performance multi-mode PD, for example, a dual-mode PD with a unique feature of high IR light response when operated under a reverse bias, and high visible light response when operated under a forward bias.

The first aspect of this invention provides a multi-mode PD comprising a functional multi-layered structure, where the functional multi-layered structure includes at least one absorber and at least one spacer; said at least one absorber and said at least one spacer are made of the same material or different materials; said multi-mode photodetector being configured to be non-responsive to electromagnetic wave of a first wavelength or visible light while being responsive to electromagnetic wave of a second wavelength or infrared or near infrared operated under a reverse bias, or be non-responsive to the electromagnetic wave of the second wavelength or infrared or near infrared while being responsive to the electromagnetic wave of the first wavelength or visible light operated under a forward bias.

In a first embodiment, the functional multi-layered structure is a combination of the absorber and the spacer, or a combination of the spacer and the absorber, or a combination of a first absorber, the spacer and a second absorber, or a combination of a first spacer, the absorber and a second spacer, or any combination of the at least one absorber and the at least one spacer.

Preferably, the wavelength of the electromagnetic wave of the first wavelength absorbed by the first absorber absorbs is shorter than the wavelength of the electromagnetic wave of the second wavelength absorbed by the second absorber in the combination of the first absorber, the spacer and the second absorber.

Preferably, the first absorber is positioned adjacent to a front electrode of the multi-mode photodetector and is sensitive to the electromagnetic wave of the first wavelength comprising visible light.

Preferably, the second absorber is positioned adjacent to a rear electrode of the multi-mode photodetector and is sensitive to the electromagnetic wave of the second wavelength comprising infrared and near infrared light.

Preferably, the first absorber is made of a material comprising poly (3-hexylthiophene) (hereinafter as "P3HT") and [6,6]-phenyl-C70-butyric-acid-methyl-ester (hereinafter as "$PC_{70}BM$") in a ratio of 100:1.

Preferably, the second absorber is made of a material comprising P3HT, poly[4,8-bis(5-(2-ethylhexyl)thiophen-2-yl)benzo[1,2-b;4,5-b']dithioph-ene-2,6-diyl-alt-(4-(2-ethylhexyl)-3-fluorothieno[3,4-b]thiophene-)-2-carboxylate-2-6-diyl)] (hereinafter as "PTB7-Th"), and $PC_{70}BM$ in a ratio of 70:30:1.

Preferably, the at least one spacer is light-absorbing so as to effectively deplete the electromagnetic wave of the first wavelength and allow the electromagnetic wave of second wavelength to be absorbed in the second absorber.

Preferably, the at least one spacer is made of P3HT for depleting the electromagnetic wave in visible light range.

In a second embodiment, the same or different materials for the at least one absorber and the at least one spacer is/are one or more of organic, polymer, perovskite, colloidal quantum dots, organic/inorganic hybrids, 1D and 2D low dimensional materials, or any combination thereof.

In a third embodiment, the multi-mode PD is configured to operate under different reverse biases to have the first-wavelength-blind or visible-blind the second-wavelength or infrared or near infrared photoresponse (i.e., non-responsive to the first wavelength or visible light, and responsive to the second or infrared or near infrared, operated under a reverse bias).

Preferably, the first-wavelength-blind or visible-blind the second-wavelength or infrared or near infrared photoresponse provided by photo-generated charge carriers in respective layers of the multi-mode PD.

In a fourth embodiment, the multi-mode PD is configured to operate under various forward biases to have the second-wavelength-blind or IR-/NIR-blind the first-wavelength or visible photoresponse (i.e., non-responsive to the second wavelength or infrared or near infrared, and responsive to the first wavelength or visible light, operated under a forward bias).

Preferably, the second-wavelength-blind or IR-/NIR-blind the first-wavelength or visible photoresponse is provided by photo-generated charge carriers in respective layers of the multi-mode photodetector.

A second aspect of the present invention provides a bias-switchable spectral response multi-mode photodetector comprising the multi-mode photodetector of the present invention and two different electrodes wherein polarity of biases applied to the two different electrodes of the multi-mode photodetector is adjusted in order to provide bias-switchable spectral response to electromagnetic waves of different wavelengths.

Preferably, the bias-switchable spectral response multi-mode photodetector is used for imaging in two or multiple distinct bands.

Preferably, the bias-switchable spectral response multi-mode photodetector is also used for applications in environmental pollution, bio, medical, agricultural, automotive, fishery, food, wellness and security monitoring and detection in two or multiple distinct bands.

Preferably, the two or multiple distinct bands include a plurality of electromagnetic waves with two or more different wavelengths selected from UV, visible, NIR, SWIR, MWIR, LWIR and VLWIR.

Preferably, the plurality of the electromagnetic waves have two or more different wavelengths ranging from 10 nm to 1000 μm.

In one example of the present multi-mode PD being a dual-mode PD, the thickness of the first absorber layer is in a range from 10 nm to 10 microns, e.g., a solution-processed 300-nm thick $P3HT:PC_{70}BM$ (100:1) visible light absorbing layer. The thickness of the optical spacer layer is in a range from 10 nm to 10 microns, e.g., a 320-nm thick P3HT optical spacer layer. The thickness of the second absorber layer is in a range from 10 nm to 10 microns, e.g., a 500-nm thick $P3HT: PTB7-Th:PC_{70}BM$ (70:30:1) NIR light absorbing layer. The example dual-mode PD possesses a unique feature of NIR light response over a wavelength range from 640 nm to 800 nm when being operated under a reverse bias, and a visible light response over a wavelength range from 310 nm to 650 nm when being operated under a forward bias. The dual-mode PD has a simultaneous high detectivity of $\sim 10^{13}$ Jones in the presence of both NIR and visible light.

Those skilled in the art will appreciate that the invention described herein is susceptible to variations and modifications other than those specifically described.

The invention includes all such variation and modifications. The invention also includes all the steps and features referred to or indicated in the specification, individually or collectively, and any and all combinations or any two or more of the steps or features.

Throughout this specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

Furthermore, throughout the specification and claims, unless the context requires otherwise, the word "include" or variations such as "includes" or "including", will be understood to imply the inclusion of a stated integer or group of integers but not the exclusion of any other integer or group of integers.

Other definitions for selected terms used herein may be found within the detailed description of the invention and apply throughout. Unless otherwise defined, all other technical terms used herein have the same meaning as commonly understood to one of ordinary skill in the art to which the invention belongs.

Other aspects and advantages of the invention will be apparent to those skilled in the art from a review of the ensuing description.

BRIEF DESCRIPTION OF THE DRAWINGS

The above and other objects and features of the present invention will become apparent from the following description of the invention, when taken in conjunction with the accompanying drawings, in which.

DETAILED DESCRIPTION OF THE INVENTION

Figure 1:
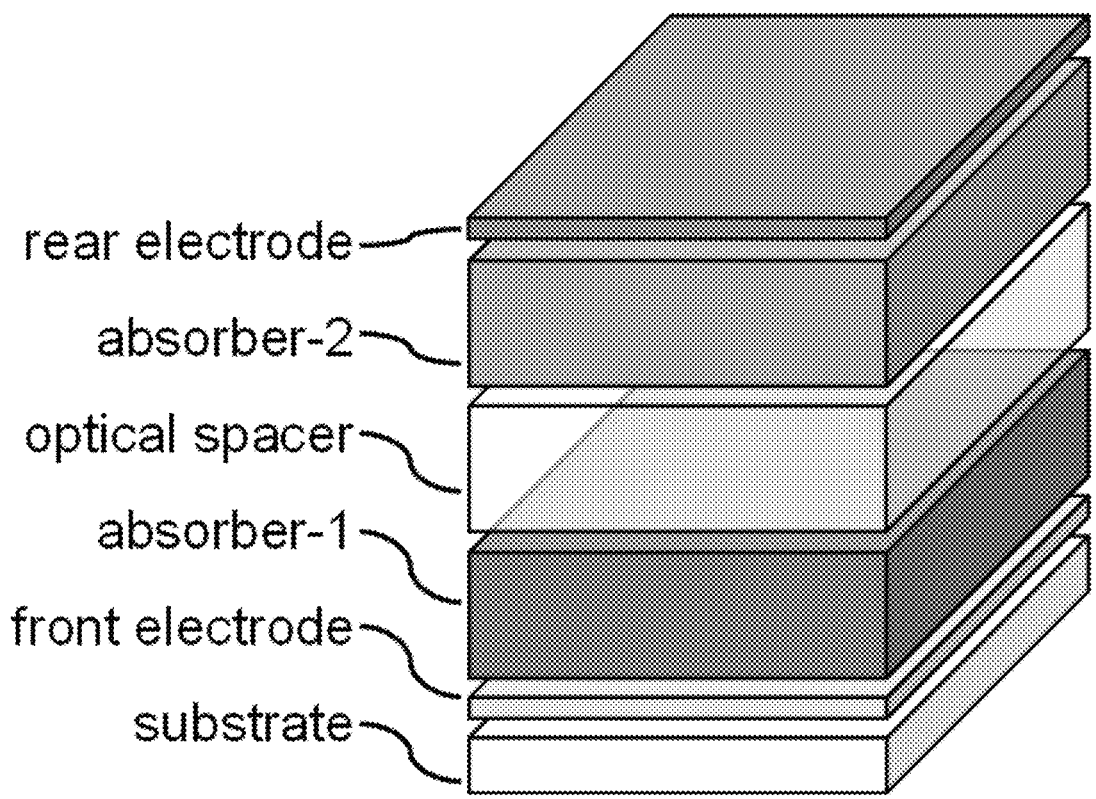
FIG. 1 presents the schematic diagram illustrating the perspective view of an example of the multi-mode PD structure: substrate/front electrode/absorber-1/optical spacer/absorber-2/rear electrode.

The multi-mode PD disclosed in this invention comprises a functional multi-layered structure including at least one absorber and at least one spacer, wherein the functional multi-layered structure is in different combinations of one or more absorbers and one or more spacers made of the same or different materials, for example, the absorber/spacer or spacer/absorber or absorber-1/spacer/absorber-2 or spacer-1/absorber/spacer-2 component and/or their combinations, e.g., a dual-mode PD comprising a functional multi-layer configuration of absorber-1 (absorber-1 absorbs the electromagnetic wave of the first wavelength comprising visible light)/optical spacer/absorber-2 (absorber-2 absorbs the electromagnetic wave of the second wavelength comprising IR light). The absorber/spacer type bias-switchable spectral response multi-mode PD can be used for applications in environmental pollution, bio, medical, agricultural, automotive, fishery, food, wellness and security monitoring, detection and imaging in two or different or multiple distinct bands.

In this invention, a multi-mode PD, e.g., dual-mode PD, comprises a stack of absorber-1/spacer/absorber-2. The absorber-1 (e.g., visible light absorber) has a layer thickness within a range from 10 nm to 10 microns, e.g., a 300-nm thick P3HT:PC$_{70}$BM (100:1) visible light absorbing layer. The thickness of the optical spacer is within a range from 10 nm to 10 microns, e.g., a 320-nm thick P3HT layer. The absorber-2 has a layer thickness within a range from 10 nm to 10 microns, e.g., a 500-nm thick P3HT:PTB7-Th:PC$_{70}$BM (70:30:1) NIR light absorbing layer. The first example dual-mode PD has a multi-layer configuration of ITO/PFN-Br/P3HT:PC$_{70}$BM (100:1)/P3HT/P3HT:PTB7-Th:PC$_{70}$BM (70:30:1)/Al. The multi-mode PD possesses a unique feature of NIR light response over a wavelength range from 640 nm to 800 nm when being operated under a reverse bias, and a visible light response over a wavelength range from 310 nm to 650 nm when being operated under a forward bias. The dual-mode PD has an impressive high optical detectivity of ~$10^{13}$ Jones in the presence of both NIR and visible light. The unique dual-mode PD with tunable responses over a broad spectral range from visible to IR light offers an attractive option for new optoelectronic device concept and applications.

Methods

Device Fabrication

The binary P3HT:PC$_{70}$BM solution was formulated by dissolving the P3HT:PC$_{70}$BM mixture, with a weight ratio of P3HT to PC$_{70}$BM of 100:1, in 1,2-dichlorobenzene (o-DCB). The ternary P3HT:PTB7-Th:PC$_{70}$BM solution was formulated by dissolving the P3HT:PTB7-Th:PC$_{70}$BM mixture in a weight ratio of P3HT to PTB7-Th to PC$_{70}$BM of 70:30:1 in o-DCB. The pre-patterned ITO glass substrates with a sheet resistance of 10 Ω/sq were cleaned by ultrasonication sequentially with diluted liquid detergent, deionized water, acetone and 2-propanol each for 30 min and dried by nitrogen gas flow. The wet-cleaned ITO/glass substrates were subjected to the UV-Ozone treatment for 15 min before loading into the glove box, with O$_2$ and H$_2$O levels <0.1 ppm, for device fabrication. The ITO surface was modified by an ultrathin PFN—Br layer, prepared by spin-coating at a rotation speed of 3000 rpm for 50 s following an annealing at 90° C. for 10 min. The use of PFN—Br-modified ITO front electrode is to create an interface dipole, assisting in bi-directional tunneling charge injection in the PD. Then, a 300-nm thick binary blend layer of P3HT:PC$_{70}$BM (100:1) was deposited on the PFN—Br-modified ITO/glass substrates by spin-coating at a rotation speed of 400 rpm for 100 s and annealed at 80° C. for 20 s. A 320-nm thick pristine P3HT optical spacer and a 500-nm thick ternary blend layer of P3HT:PTB7-Th:PC$_{70}$BM (70:30:1) were first coated on the pre-cleaned silicon (Si) wafers, respectively. A 320-nm thick pristine P3HT optical spacer was then transferred onto the surface of the binary blend P3HT:PC$_{70}$BM (100:1) visible light absorbing layer by the lamination transfer using a polydimethylsiloxane (PDMS) mold, forming a bi-layer P3HT:PC$_{70}$BM (100:1) (300 nm)/P3HT (320 nm) structure. A 500-nm thick P3HT:PTB7-Th:PC$_{70}$BM (70:30:1) NIR light absorbing layer was then overlaid on the surface of the bi-layer P3HT:PC$_{70}$BM (100:1) (300 nm)/P3HT (320 nm) structure using the same lamination transfer process, forming a tri-layer configuration of P3HT:PC$_{70}$BM (100:1) (300 nm) (absorber-1)/P3HT (320 nm) (spacer)/P3HT:PTB7-Th:PC$_{70}$BM (70:30:1) (500 nm) (absorber-2) on the PFN—Br-modified ITO/glass substrate. The use of the PDMS lamination approach is to avoid the damage to the underlying functional materials in the tri-layer active layer configuration if it were formed by the full-solution process, as the same o-DCB solvent was used in the binary P3HT:PC$_{70}$BM, pristine P3HT and ternary P3HT:PTB7-Th:PC$_{70}$BM solutions. The multilayer samples were then transferred to the adjacent vacuum chamber, with a base pressure of 5×10$^{-4}$ Pa for deposition of a 100-nm thick Al electrode. The PDs have an active area of 2.0 mm×2.0 mm, defined by the overlapping area between the front ITO electrode and the rear Al electrode.

PDMS Transfer Method

The stack of P3HT:PC$_{70}$BM (100:1) (300 nm)/P3HT (320 nm)/P3HT:PTB7-Th:PC$_{70}$BM (70:30:1) (500 nm) films was fabricated by transfer process using a flat PDMS mold. A 1-mm thick flat PDMS mold, with an area of 25 mm×25 mm, was prepared using the PDMS solution, formulated by mixing the elastomer and curing agent solution in a weight ratio of 10:1. A 300-nm thick binary blend P3HT:PC$_{70}$BM (100:1) visible light absorbing layer was deposited on the glass/ITO/PFN—Br substrates by spin-coating. A 320-nm thick pristine P3HT optical spacer layer and a 500-nm thick ternary blend PTB7-Th:PC$_{70}$BM (70:30:1) NIR light absorbing layer were coated on the Si wafers separately. A flat PDMS mold was then pressed on the surface of the functional layer/Si wafer, and the sample was dipped in the distilled water for 1 min, the Si wafer was removed carefully leaving the functional layer on the flat PDMS mold. The transfer of the P3HT layer was done by pressing the P3HT-coated PDMS mold on the surface of the P3HT:PC$_{70}$BM (100:1) (300 nm)/PFN-Br/ITO/glass substrate in the glovebox, followed by an annealing for 15 min, the flat PDMS mold was removed carefully forming a bi-layer P3HT (320 nm)/P3HT:PC$_{70}$BM (100:1) (300 nm) stack on the PFN—Br-modified ITO/glass substrate. Next, the transfer of the P3HT:PTB7-Th:PC$_{70}$BM (70:30:1) layer was done by pressing the P3HT:PTB7-Th:PC$_{70}$BM (70:30:1)-coated PDMS mold on the surface of P3HT (320 nm)/P3HT: PC$_{70}$BM (100:1) (300 nm)/PFN-Br/ITO/glass substrate, following by an annealing for 15 min, the flat PDMS mold was then removed carefully, forming a tri-layer stack of P3HT: PC$_{70}$BM (100:1) (300 nm)/P3HT (320 nm)/PTB7-Th: PC$_{70}$BM (70:30:1) (500 nm) on PFN—Br-modified ITO/glass substrate.

Optical Simulations

The optical field distribution and profile of the photo-generated charge carriers in the device were simulated using optical admittance analyses. The charge generation rate in the active layer was estimated using the following equation:

$$G(\lambda) \propto \frac{\alpha(\lambda)}{h\nu} \times \eta \quad (1)$$

where $G(\lambda)$ is the density of the photo-generated charge carriers, $\alpha(\lambda)$ is the absorbance of the active layer, h is the Plank constant, v is the photon frequency and $\eta$ is the exciton dissociation efficiency. As an approximation, a constant $\eta$ across the active layer was adopted in the calculation.

Characterizations and Measurements

The I-V characteristics of the PDs were measured by a Keithley 2614B source meter. Two LED light sources with the different peak emission wavelengths of 770 nm (NIR light) and 460 nm (visible light), driven by a RIGOL DG4102 function generator, were used for measuring the NIR and visible light responses of the dual-mode PDs. The intensity of the NIR and visible light sources was controlled using a set of neutral optical filters. EQE, defined as the ratio of the number of the photo-generated charge carriers to the number of the incident photons, was calculated using the following equation:

$$EQE = \frac{(I_l - I_d)/e}{P_{in}/h\nu} \quad (2)$$

where $I_l$ and $I_d$ are the photocurrent and dark current, e is the elementary electron charge ($1.6 \times 10^{-19}$ C) and $P_{in}$ is the power of the incident light. The monochromatic light source, generated by a Zenon lamp and the Bentham TMc300 monochromator, was used in EQE measurement. Transient photoresponses of the dual-mode PDs were measured using a Tektronix PD2022B digital phosphor oscilloscope. The DC bias used in the transient photoresponse measurements was controlled by the RIGOL DP821A DC power supply.

Results and Discussion

Figure 2:
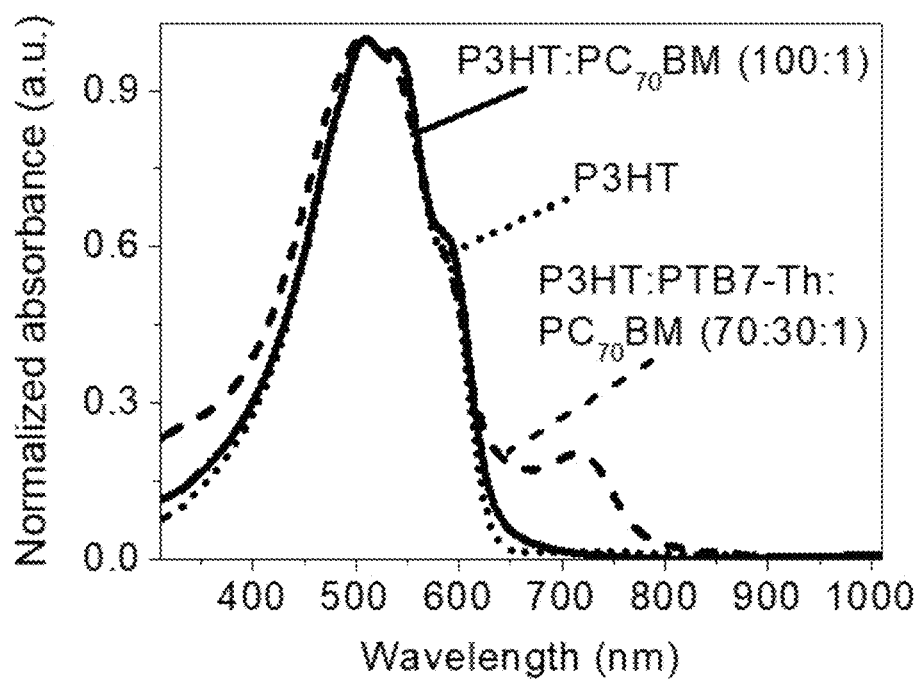
FIG. 2 shows the normalized absorption spectra, measured for a binary blend P3HT:PC$_{70}$BM (100:1) layer (absorber-1), a pristine P3HT layer (spacer) and a ternary blend P3HT:PTB7-Th:PC$_{70}$BM (70:30:1) layer (absorber-2). The functional layers of P3HT:PC$_{70}$BM (100:1), pristine P3HT and P3HT:PTB7-Th:PC$_{70}$BM (70:30:1) were used to construct the first example PD in the present invention.
Figure 3:
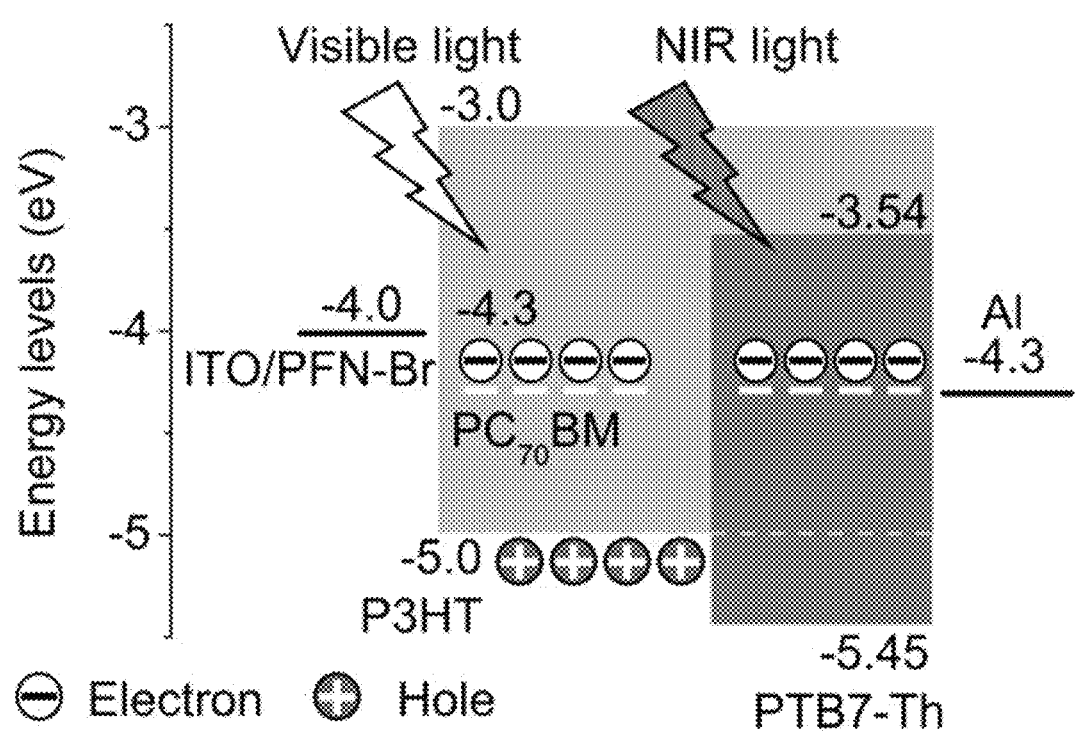
FIG. 3 shows the schematic energy level diagram of the functional materials used in the first example PD in the present invention.

This invention discloses a multi-mode PD with a unique feature of high photoresponses in two or more different or multiple distinct bands, e.g., the first example PD possesses a high IR light response when being operated under a reverse bias, and a visible light response when being operated under a forward bias. The perspective view of the first example multi-mode PD structure, substrate/front electrode/absorber-1/optical spacer/absorber-2/rear electrode, is shown in FIG. 1. A high performance dual-mode PD, with a layer configuration of ITO/PFN-Br/P3HT:PC$_{70}$BM (100:1)/P3HT/P3HT:PTB7-Th:PC$_{70}$BM (70:30:1)/Al, possesses a unique feature of NIR light response over the wavelength range from 640 nm to 800 nm, operated under a reverse bias, and visible light response over a wavelength range from 310 nm to 650 nm, operated under a forward bias. The normalized absorption spectra, measured for a 300-nm thick binary blend P3HT:PC$_{70}$BM (100:1) layer, a 320-nm thick pristine P3HT layer and a 500-nm thick ternary blend P3HT:PTB7-Th:PC$_{70}$BM (70:30:1) layer are plotted in FIG. 2. Compared to the absorption spectra measured for the pristine P3HT and binary blend P3HT: PC$_{70}$BM (100:1) layers, it is clear that the ternary blend P3HT:PTB7-Th:PC$_{70}$BM (70:30:1) film has an obvious extended absorption in the NIR light over the wavelength range from 650 nm to 800 nm. The schematic energy level diagram of the corresponding functional materials used in the dual-mode PDs is shown in FIG. 3. This indicates visible absorption in the absorber-1 near the front electrode and NIR absorption in the absorber-2 close to the rear electrode.

Figure 4A:
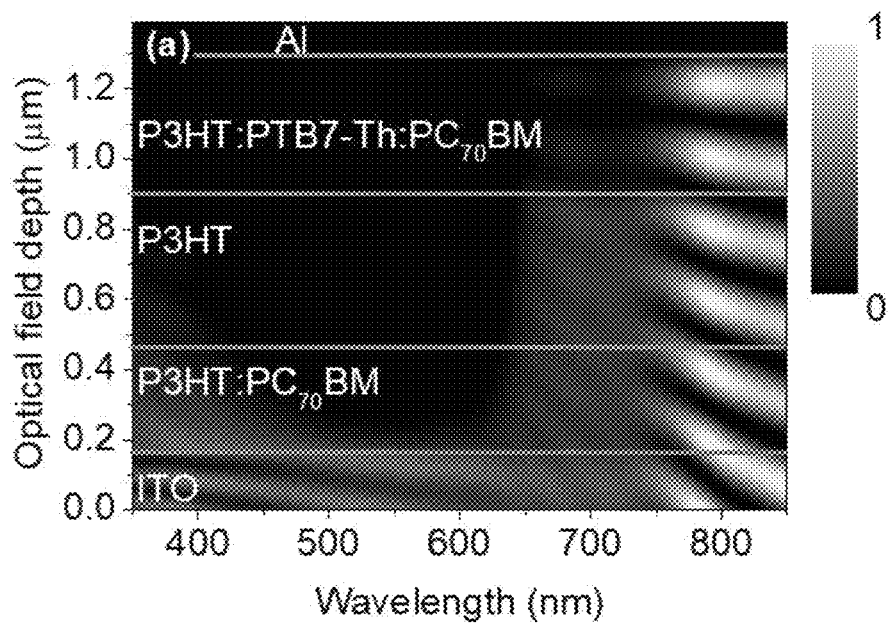
FIG. 4A shows the simulated optical field distribution across the 300-nm thick binary blend P3HT:PC$_{70}$BM (100:1) visible light absorbing layer (absorber-1), 320-nm thick pristine P3HT optical spacer layer and 500-nm thick ternary blend P3HT:PTB7-Th:PC$_{70}$BM (70:30:1) NIR light absorbing layer (absorber-2) in the dual-mode PD.
Figure 4B:
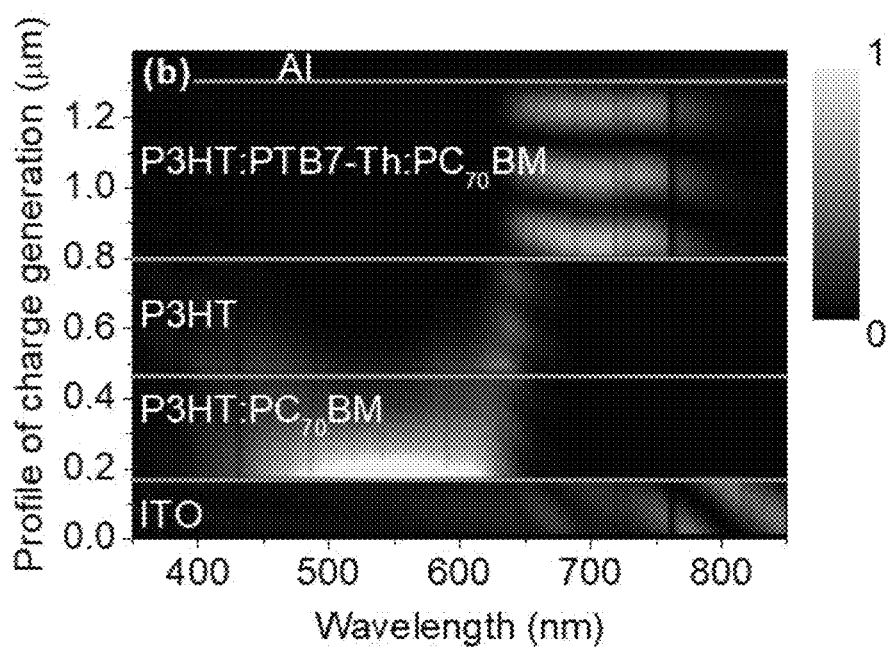
FIG. 4B shows the normalized distribution of photo-generated charge carriers across the 300-nm thick binary blend P3HT:PC$_{70}$BM (100:1) visible light absorbing layer (absorber-1), 320-nm thick pristine P3HT optical spacer layer and 500-nm thick ternary blend P3HT:PTB7-Th:PC$_{70}$BM (70:30:1) NIR light absorbing layer (absorber-2) in the dual-mode PD.
Figure 4C:
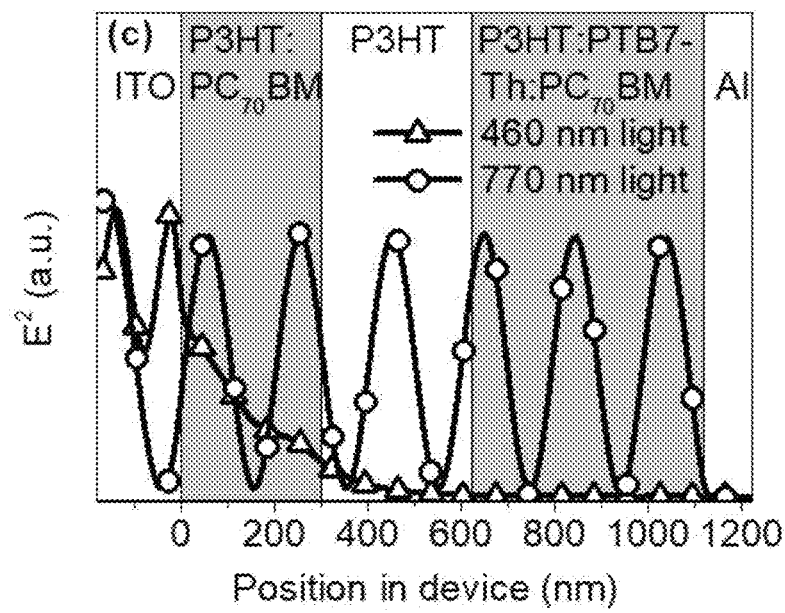
FIG. 4C shows the optical field distribution for the dual-mode PD at two different wavelengths of 460 nm and 770 nm.
Figure 4D:
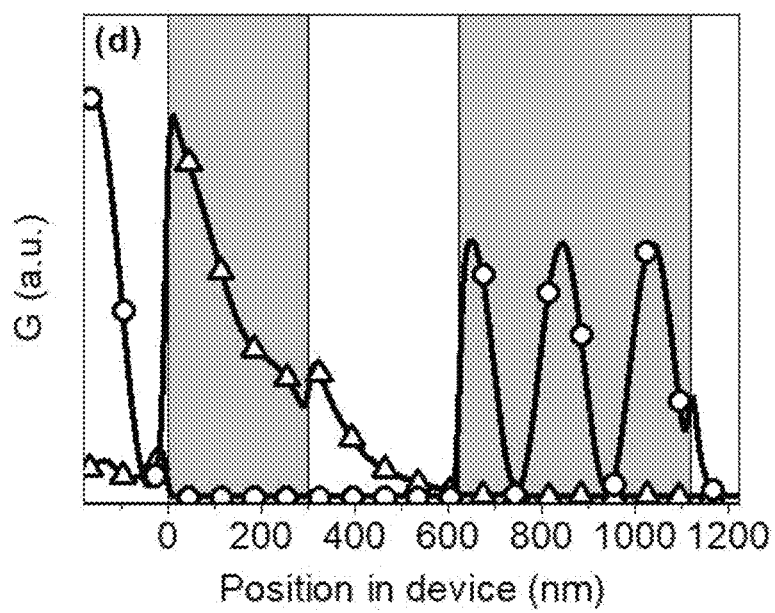
FIG. 4D shows the profile of the photo-generated charge carriers calculated for the dual-mode PD at two different wavelengths of 460 nm and 770 nm.

The optical field distribution and profile of charge generation distribution in the dual-mode PD, e.g., with a layer configuration comprising ITO/PFN-Br/P3HT:PC$_{70}$BM (100:1) (300 nm)/P3HT (320 nm)/P3HT:PTB7-Th:PC$_{70}$BM (70:30:1) (500 nm)/Al (100 nm), was calculated using the optical admittance analysis. FIG. 4A plots the optical field distribution the dual-mode PD as a function of the wavelength, revealing the profile of the wavelength-dependent light intensity in different functional layer. FIG. 4A reveals clearly that the incident light with wavelength >650 nm can only be absorbed in the 500-nm thick ternary blend P3HT: PTB7-Th:PC$_{70}$BM (70:30:1) layer in the PD. The normalized distribution of the photo-generated charge carriers across the P3HT:PC$_{70}$BM (100:1) visible light absorbing layer, pristine P3HT optical spacer and P3HT:PTB7-Th: PC$_{70}$BM (70:30:1) NIR light absorbing layer as a function of the wavelength is shown in FIG. 4B. It becomes clear that the incident light with wavelengths shorter than 650 nm is mainly absorbed by the 300-nm thick binary blend P3HT: PC$_{70}$BM (100:1) layer. The 320-nm thick pristine P3HT layer acts as an optical spacer to deplete the visible light that is not fully absorbed by the binary blend P3HT:PC$_{70}$BM (100:1) layer, allowing the long wavelength light to reach the ternary blend P3HT:PTB7-Th:PC$_{70}$BM (70:30:1) layer. The optical field distribution, profile of the photo-generated charge carriers calculated for the PD at two different wavelengths of 460 nm and 770 nm are plotted in FIGS. 4C and 4D. It is clear that the photo charge carriers generated by the 460 nm light are mainly retained within the 300-nm thick binary blend P3HT:PC$_{70}$BM (100:1) visible light absorbing layer. The short wavelength light (460 nm) is fully depleted by the 320-nm thick pristine P3HT optical spacer layer. The simulation results show that the IR light, e.g., with a wavelength of 770 nm, penetrates through the binary blend P3HT:PC$_{70}$BM (100:1) visible light absorbing layer and P3HT optical spacer to generate the photo charge carriers in the 500-nm thick ternary blend P3HT:PTB7-Th:PC$_{70}$BM (70:30:1) NIR light absorbing layer.

Figure 5:
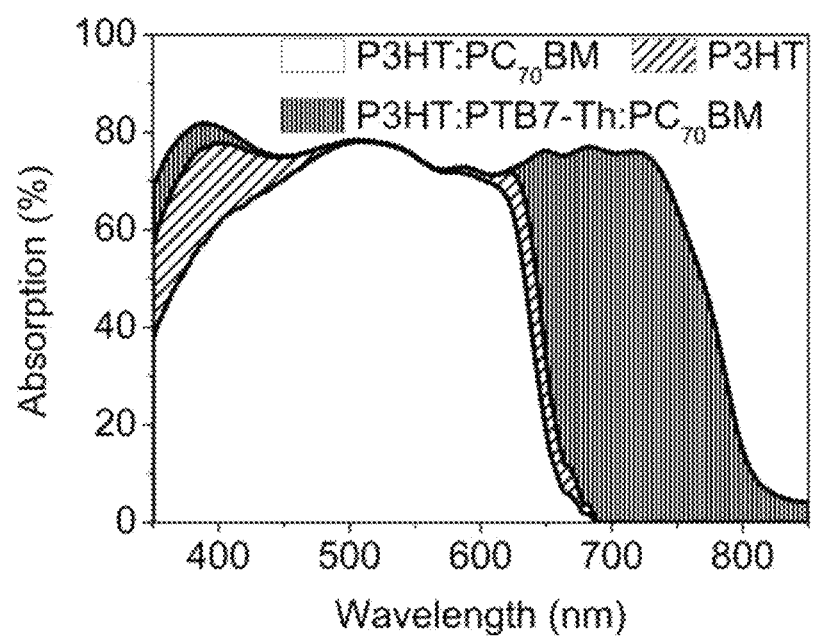
FIG. 5 shows the absorption spectra calculated for a 300-nm thick binary blend P3HT:PC$_{70}$BM (100:1) layer (absorber-1), a 320-nm thick pristine P3HT (spacer) and a 500-nm thick ternary blend P3HT:PTB7-Th:PC$_{70}$BM (70:30:1) layer (absorber-2).

The absorption spectra calculated for a 300-nm thick binary blend P3HT:PC$_{70}$BM (100:1) visible light absorbing layer, a 320-nm thick pristine P3HT optical spacer and a 500-nm thick ternary blend P3HT:PTB7-Th:PC$_{70}$BM (70:30:1) NIR light absorbing layer in the PD are plotted in FIG. 5.

Figure 6A:
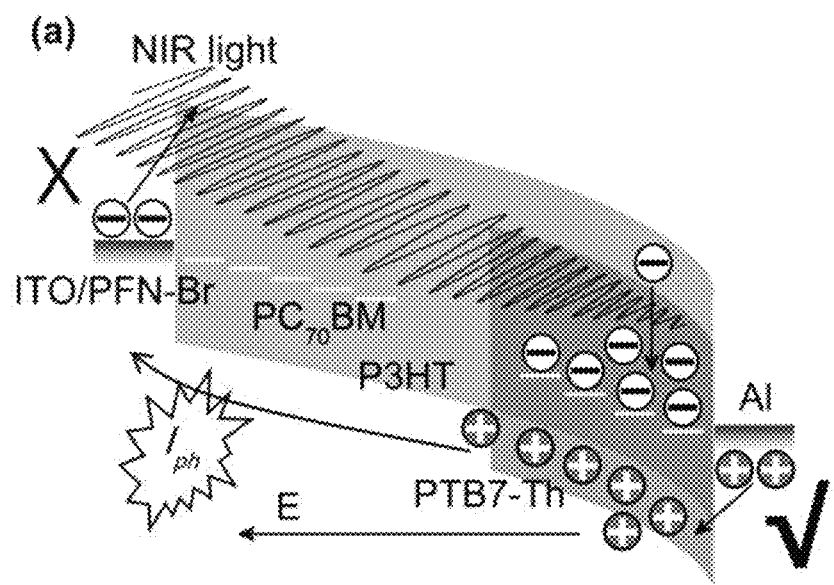
FIG. 6A is a schematic diagram illustrating the working principles of the first example dual-mode PD operated under a reverse bias that producing a photocurrent in the presence of the NIR light, enabled by the accumulation of the photo-generated charge carriers at the absorber/rear electrode interface.
Figure 6B:
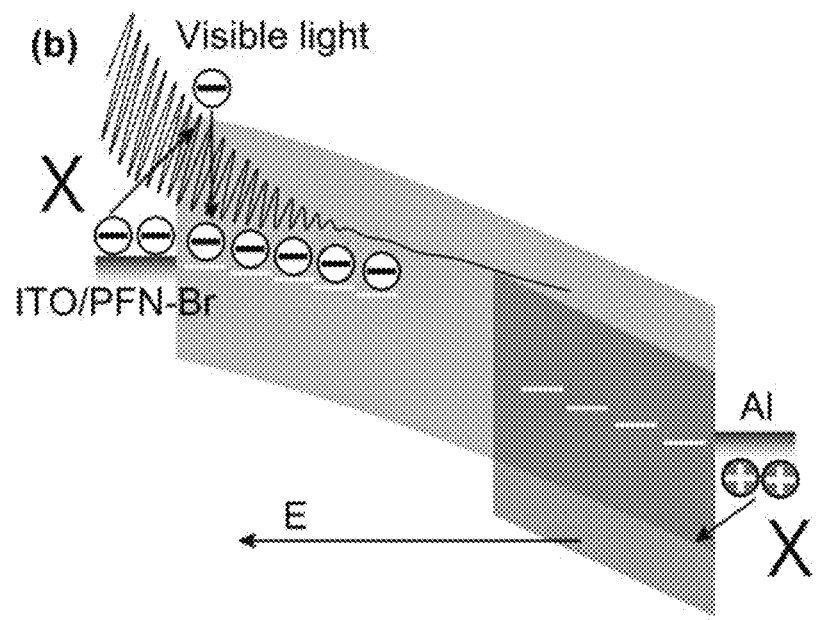
FIG. 6B is a schematic diagram illustrating the working principles of the first example dual-mode PD operated under a reverse bias that without generating photocurrent in the presence of the visible light at the front electrode/absorber interface.

To understand the unique spectral responses of the absorber/spacer type PD, the distinct dual-mode IR light and visible light detection phenomena of the PD operated under the reverse and forward biases are analyzed. The miscible PC$_{70}$BM molecules distributed in the binary blend P3HT: PC$_{70}$BM (100:1) visible light absorbing layer and ternary blend P3HT:PTB7-Th:PC$_{70}$BM (70:30:1) NIR light absorbing layer in the absorber/spacer type tri-layer PD. The charge injection occurs at the absorber/rear electrode interface in the dual-mode PD operated under a reverse bias, as shown in FIG. 6A. Under a reverse bias, however, the charge injection at the PFN—Br-modified ITO/P3HT:PC$_{70}$BM (100:1) interface is suppressed. In the presence of the visible light, no photo-generated charge carriers that can be trapped by the PC$_{70}$BM molecules in the NIR absorbing layer. Hence, no photocurrent is generated in the dual-mode PD, as illustrated in FIG. 6B. This is because the visible light is absorbed only in the binary blend P3HT:PC$_{70}$BM (100:1) visible light absorbing layer and is fully depleted by the P3HT optical spacer, as depicted in FIG. 4B, leading to formation of the trapped photogenerated charge carriers at the PFN—Br-modified ITO/P3HT:PC$_{70}$BM (100:1) interface. Therefore, the dual-mode PD responds only to the NIR light functioning as an NIR PD when it is operated under a reverse bias, and achieves visible-blind infrared photoresponse.

Figure 6C:
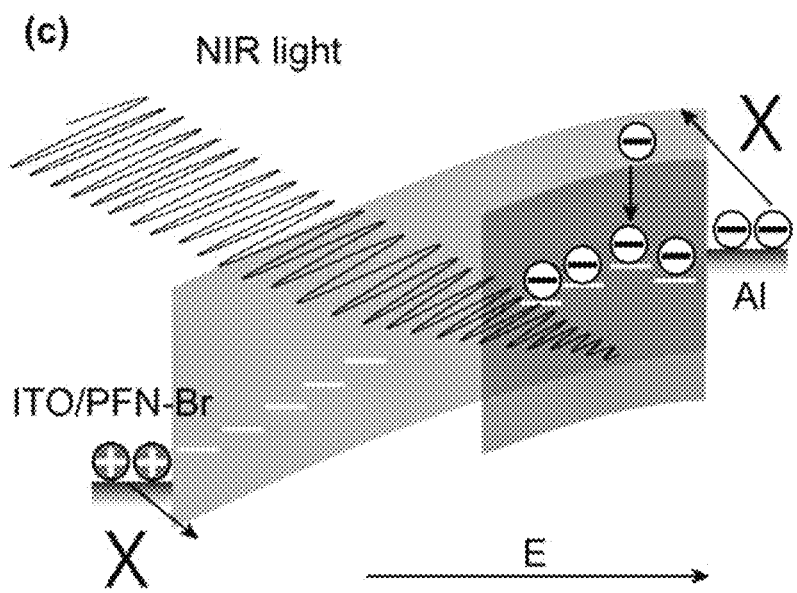
FIG. 6C is a schematic diagram illustrating the working principles of the first example dual-mode PD operated under a forward bias that without generating photocurrent at the front electrode/absorber interface in the presence of NIR light.
Figure 6D:
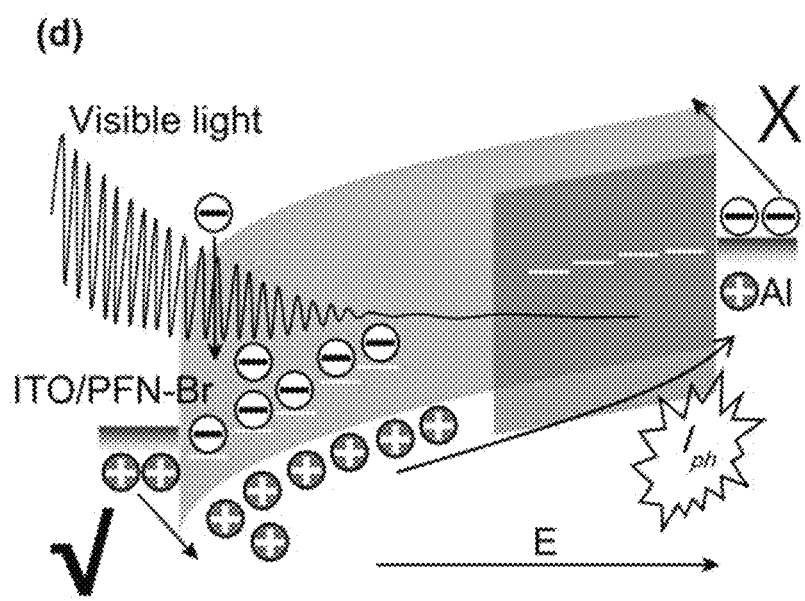
FIG. 6D is a schematic diagram illustrating the working principles of the first example dual-mode PD operated under a forward bias that generating a photocurrent in the presence of the visible light.

Under a forward bias, the charge injection behavior in the dual-mode PD is very different as compared to the PD that is operated under a reverse bias in the presence of the NIR light, as illustrated in FIG. 6C. Under a forward bias, the charge injection at the P3HT:PTB7-Th:PC$_{70}$BM (70:30:1)/Al interface is suppressed due to the existence of a large interfacial energy barrier. The charge injection at the PFN—Br-modified ITO/P3HT:PC$_{70}$BM (100:1) interface is suppressed due to the high interfacial energy barrier. In the presence of the visible light, the charge injection takes place at the PFN—Br-modified ITO/P3HT:PC$_{70}$BM (100:1) interface in the dual-mode PD under a forward bias, as shown in FIG. 6D. As such, the dual-mode PD, only responses to the visible light serving as a visible light PD operated under a forward bias, and achieves IR-blind visible photoresponse.

Figure 7A:
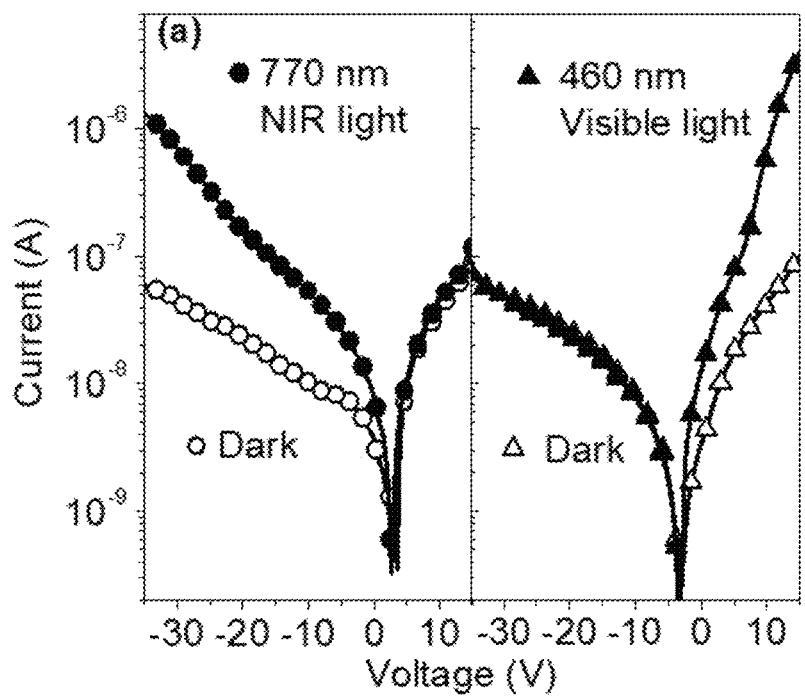
FIG. 7A plots the I-V characteristics measured for the first example dual-mode PD in the presence of NIR light (770 nm) and visible light (460 nm) sources.

The current-voltage (I-V) characteristics of the dual-mode PD in the presence of NIR light (770 nm), measured by scanning from −35 V to 15 V, are plotted in FIG. 7A. I-V characteristics of the dual-mode PD in the visible light (460 nm), measured by scanning from 15 V to −35 V are plotted in FIG. 7A. In FIG. 7A, a significant photocurrent was obtained for the reverse-biased PD in the presence of the NIR light. The photocurrent of the PD increases with the reverse bias. The bias-switchable spectral response PD remained an almost constant current when it was operated under different forward biases (in the visible light detection mode) in the presence of the IR light. In the presence of the visible light, the strong photoresponses were observed for the PD operated under the different forward biases, remaining a low current, similar to the dark current, when the PD was under different reverse biases (in the IR detection mode), as shown in FIG. 7A. The dual-mode PD with a unique feature of high NIR light response when being operated under a reverse bias, and high visible light response when being operated under a forward bias, is clearly demonstrated.

Figure 7B:
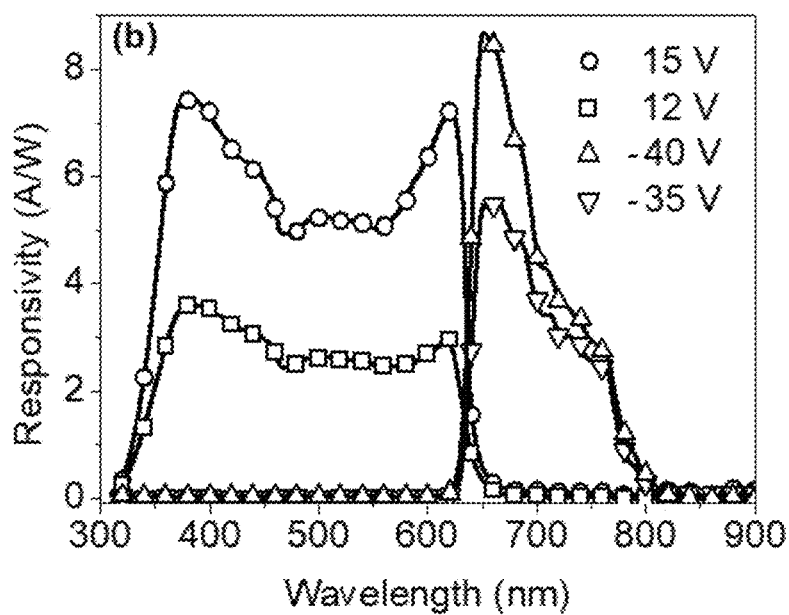
FIG. 7B shows the responsivity spectra measured for the dual-mode PD in the IR light detection mode, operated under two different reverse biases of −35 V and −40 V, and in the visible light detection mode, operated under two different forward biases of 12 V and 15 V.

The responsivity (in A/W) measured for the dual-mode PD operated at the IR mode (under different reverse biases) and visible light mode (under different forward biases) are shown in FIG. 7B. It can be clearly seen that the dual-mode PD had different spectral responses when it is operated under the forward and reverse biases. The dual-mode PD responses over the wavelength range from 310 nm to 650 nm when it is operated under a forward bias. The dual-mode PD responses primary over a wavelength range from 640 nm to 800 nm when being operated under a reverse bias. Benefiting from the photo-multiplication effect, a responsivity of 8.66 A/W was realized for the IR mode of the PD operated under −40 V. A peak responsivity of 7.47 A/W was obtained for the dual-mode PD in the presence of the visible light when being operated under a forward bias of 15 V.

Figure 7C:
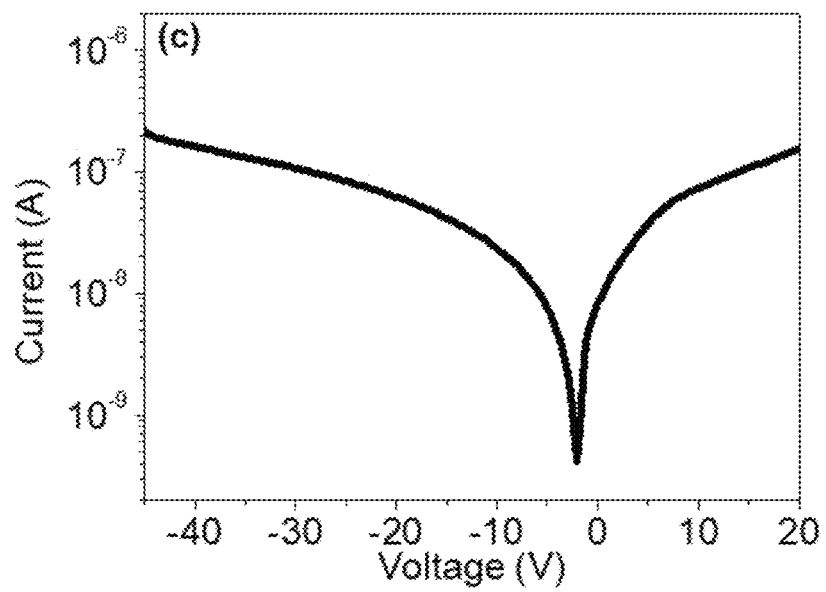
FIG. 7C plots the I-V characteristics measured for the first example dual-mode PD in the absence of light, averaged from >seven measurements.
Figure 7D:
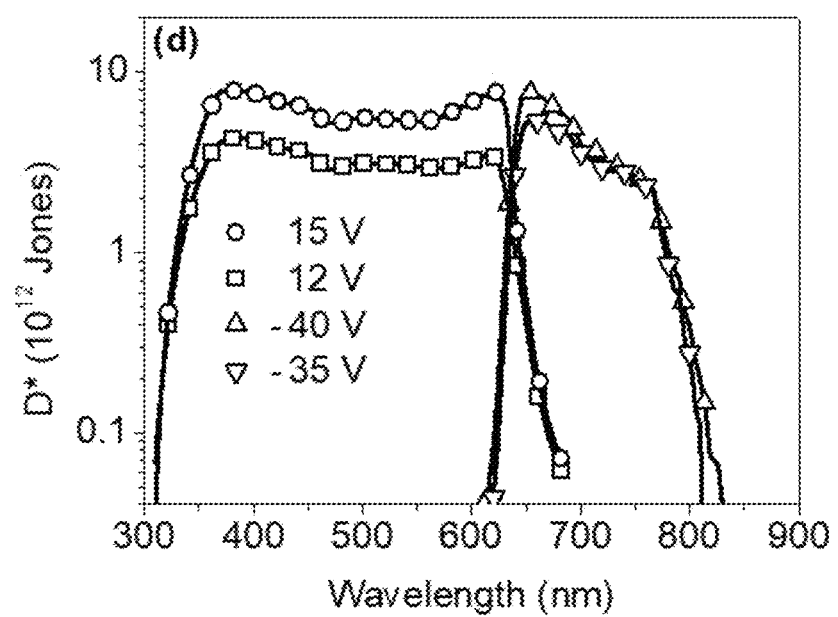
FIG. 7D plots the wavelength dependent D* of the first example dual-mode PD operating in the IR and visible light detection modes.

The specific detectivity (D*) of the dual-mode PD was also analyzed, which is closely associated with EQE and noise current. The performance repeatability of the dual-mode PD was evaluated by repeating the I-V characteristic measurements continuously for more than 7 times, and the average of the measured results are plotted in FIG. 7C, indicating a good repeatability and stability of the I-V characteristics. The shot noise is used to calculate for D* as an approximation using the following equation:

$$D^* = \frac{EQE \cdot e \cdot \lambda}{hc \cdot \sqrt{2e \cdot J_{dark}}} \text{ (Jones)} \quad (3)$$

where $J_{dark}$ is the dark current density, c is the speed of light. The D* as a function of the wavelength obtained for the dual-mode PD in the IR and visible light detection modes when being operated under different reverse and forward biases are plotted in FIG. 7D. The dual-mode PD with a high D* of ~10$^{13}$ Jones was obtained in the presence of the NIR and visible light, revealing the dual-mode PD with comparable high performance for both NIR and visible light detection. D* of the dual-mode PD, measured in the IR mode, increases with the decrease in the reverse bias from −35 V to −40 V, and that for the dual-mode PD in the visible light mode increases with forward bias from 12 V to 15 V, realized by the dramatically enhanced photocurrent and low dark current in the dual-mode PD.

A summary of the dark current, responsivity, EQE and D*, measured for the first example dual-mode PD operated under different reverse and forward biases, using a short wavelength (376 nm) and a long wavelength (654 nm) light sources, is listed in Table 1. A high responsivity of 14.44 A/W, EQE of 4767% and a high D* of 1.41×10$^{13}$ Jones were obtained for the dual-mode PD in the presence of short wavelength, e.g., measured for the PD operated under a forward bias of 18 V using a 376 nm light source. A responsivity of 12.94 A/W, EQE of 2454% and a D* of 9.85×10$^{12}$ Jones were obtained for the dual-mode PD, operated under a reverse bias of −45 V, in the presence of long wavelength light.

TABLE 1

Summarized photodetection parameters. The maximum EQE and detectivity measured for the first example dual-mode PD using a short wavelength (376 nm) and a long wavelength (654 nm) light sources, operated under different forward and reverse biases.

| Light sources | Bias (V) | Dark current (×10$^{-7}$A) | Responsivity (A/W) | EQE (%) | D* (×10$^{12}$ Jones) |
|---|---|---|---|---|---|
| 376 nm | 9 | 0.67 | 1.31 | 432 | 1.79 |
|  | 12 | 0.88 | 3.53 | 1163 | 4.24 |
|  | 15 | 1.08 | 7.47 | 2465 | 8.03 |
|  | 18 | 1.33 | 14.44 | 4767 | 14.10 |
| 654 nm | −30 | 1.07 | 3.65 | 692 | 3.94 |
|  | −35 | 1.33 | 5.48 | 1040 | 5.31 |
|  | −40 | 1.61 | 8.66 | 1643 | 7.64 |
|  | −45 | 2.16 | 12.94 | 2454 | 9.85 |

Figure 8A:
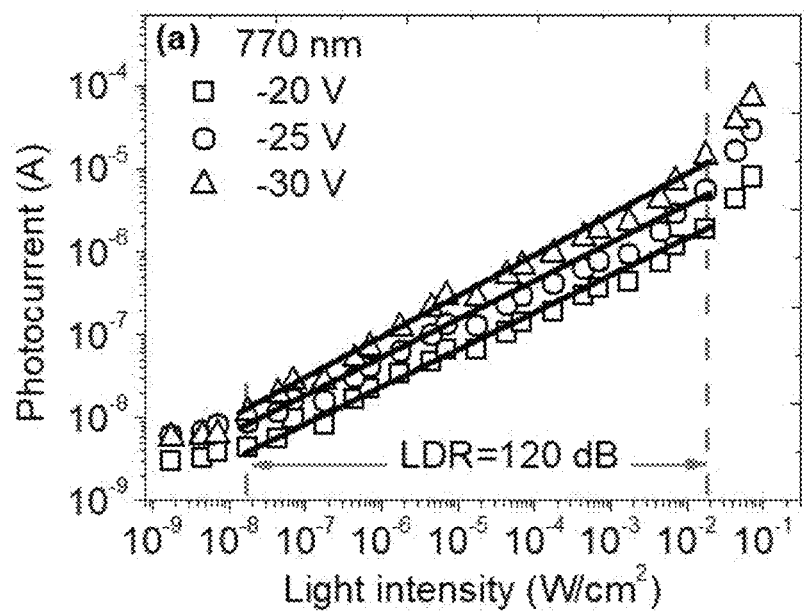
FIG. 8A shows the linear dynamic range (LDR) characteristics as a function of the light intensity, measured for the first example dual-mode PD operated in the presence of NIR light (770 nm) sources under different reverse biases.
Figure 8B:
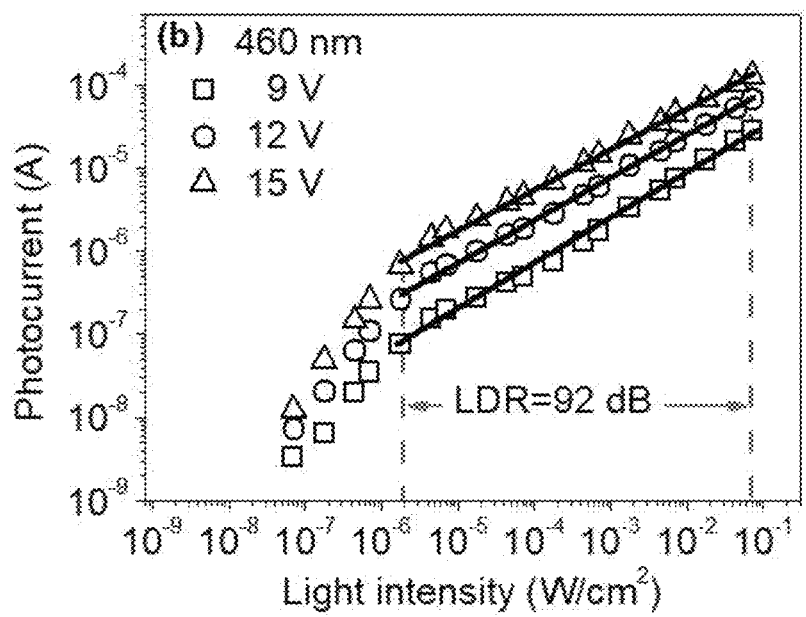
FIG. 8B shows the LDR characteristics as a function of the light intensity, measured for the dual-mode PD operated in the presence of visible light (460 nm) sources under different forward biases.

The LDR, defined as the linear light intensity dependence of the photocurrent in a PD, of the dual-mode PD in the presence of the IR and visible light was analyzed. The LDR can be analyzed using the following equation:

$$LDR = 20\log\frac{I_{upper}}{I_{lower}} \quad (4)$$

where $I_{upper}$ and $I_{lower}$ are the maximum and minimum limits of the intensity of light that the photocurrent of an PD follows a linear dependence on light intensity. LDR characteristics measured for the dual-mode PD in the IR light detection mode, e.g., operated under different reverse biases of −20 V, −25 V and −30 V, using an NIR light-emitting diode (LED) light (770 nm) source over the NIR light intensity range from $10^{-9}$ W/cm² to $10^{-1}$ W/cm², are plotted in FIG. 8A. An LDR of 120 dB was obtained for the dual-mode PD operated in the IR light detection mode. The photocurrent of the PD deviates from the linear light intensity dependence when the NIR light intensity was below $10^{-8}$ W/cm². The LDR characteristics of the dual-mode PD operated under different forward biases of 9 V, 12 V and 15 V, measured using a visible LED light (460 nm) source over the visible light intensity range from $10^{-7}$ W/cm² to $10^{-1}$ W/cm², are plotted in FIG. 8B. The dual-mode PD had an LDR of 92 dB and departed from the linear light intensity dependence when the intensity of the visible light was below $10^{-6}$ W/cm². The results reveal that the relative stable LDR of 120 dB in the presence of NIR light and an LDR of 92 dB in the presence of the visible light were obtained for the dual-mode PD operated in the IR and visible light detection modes.

Figure 9:
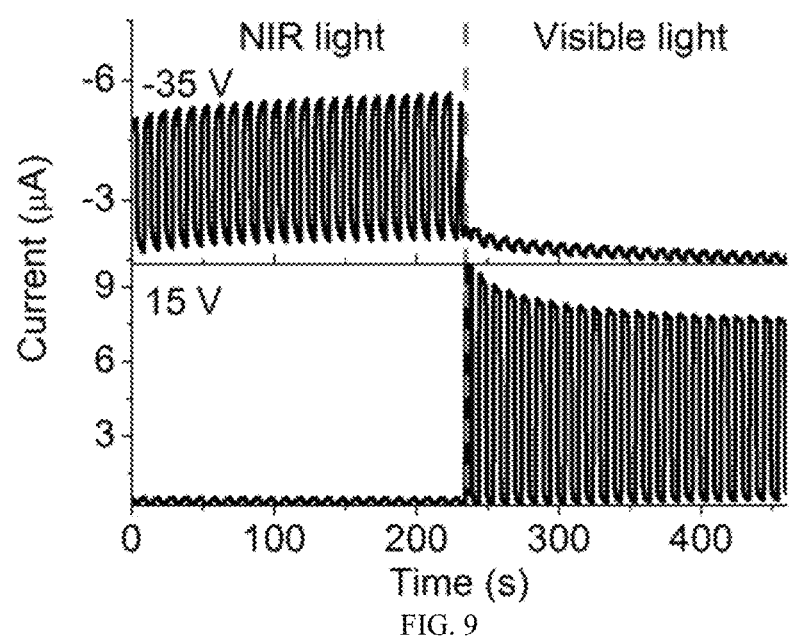
FIG. 9 shows the transient photoresponses measured for the first example dual-mode PD operated in the presence of the NIR light (770 nm) and visible light (460 nm) sources.

Transient photo responses of the dual-mode PD measured in the presence of the NIR light (770 nm) and visible light (460 nm) sources are shown in FIG. 9. In the measurement, the dual-mode PD was biased at −35 V or 15 V and exposed to a 0.1 Hz frequency modulated monochromatic light source. During the first 4 min, the dual-mode PD was biased at −35 V and exposed to the modulated NIR light (770 nm) source establishing a stable photo response to the NIR light. Then, the 0.1 Hz frequency modulated NIR light source was replaced with a 0.1 Hz frequency modulated visible light (460 nm) source. The photocurrent of the reverse-biased PD decreased to zero when the visible light source was replaced for the NIR light source, as shown in FIG. 9, indicating its insensitive nature to the visible light when it is operated in its IR detection mode. This shows that the dual-mode PD, operated under a reverse bias of −35 V, is only sensitive to the NIR light, and it does not respond to the visible light. When the dual-mode PD was operated under a forward bias (15 V), it responded only to the visible light with almost no photo response to the IR light. The transient photo response results confirm that the dual-mode PD developed in this work has a unique feature of high IR light response, operated under a reverse bias, and high visible light response, operated under a forward bias.

Figure 10A:
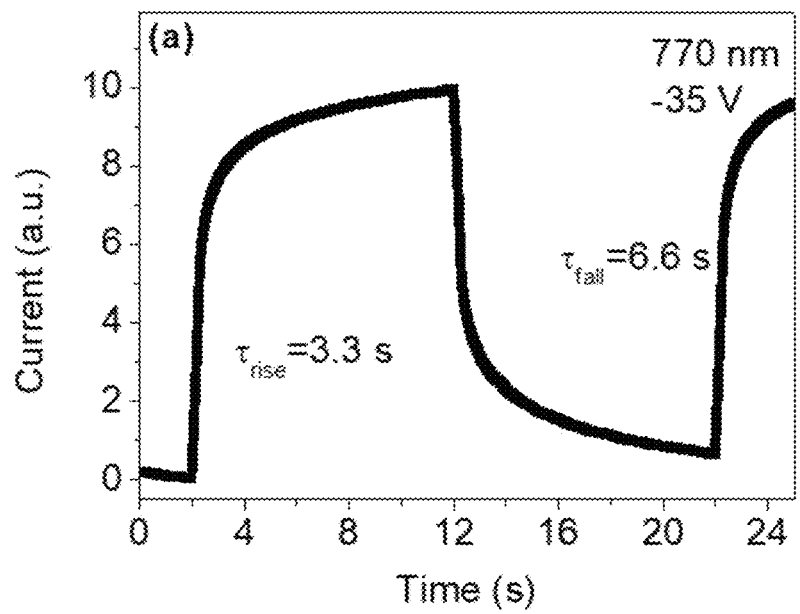
FIG. 10A shows the transient photoresponses measured for the first example dual-mode PD operated in the IR mode.
Figure 10B:
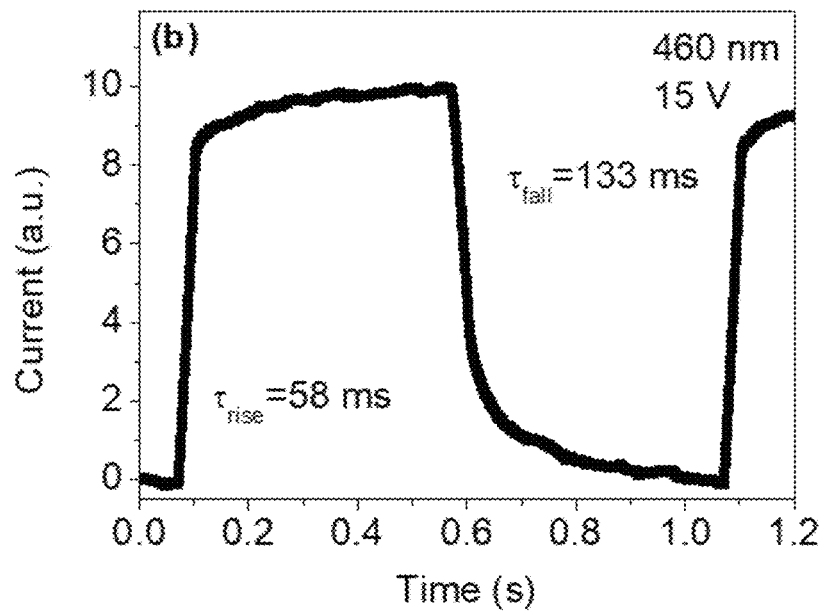
FIG. 10B shows the transient photoresponses measured for the first example dual-mode PD operated in the visible light mode.

The photoresponse time of the PD were analyzed by measuring the rising time $\tau_{rise}$, defined as the time taken for the PD reaches to the 90% of its maximum photocurrent after switching on the modulated light source, and the falling time $\tau_{fall}$, defined as the time taken for the photocurrent reduces to 10% of its maximum value in the PD after switching off the modulated light source in the measurement. In the presence of the modulated NIR light (770 nm), the $\tau_{rise}$ of 3.3 s and $\tau_{fall}$ of 6.6 s were obtained for the dual-mode PD operated under a reverse bias of −35 V as shown in FIG. 10A. In the presence of the modulated visible light (460 nm), the $\tau_{rise}$ of 58 ms and $\tau_{fall}$ of 133 ms were obtained for the dual-mode PD operated under a forward bias of 15 V as shown in FIG. 10B.

Figures 11A, 11B, 11C:
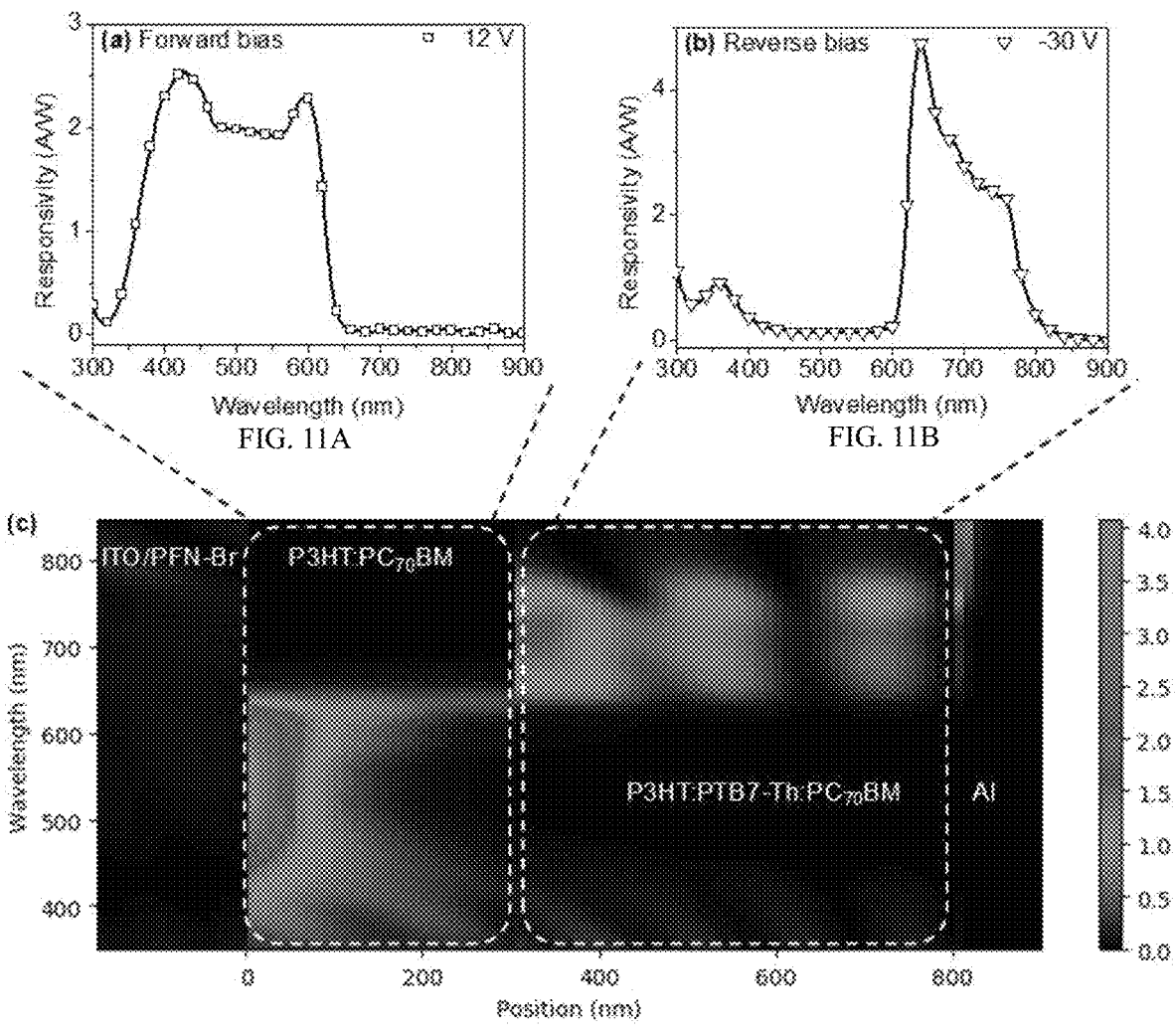
FIG. 11A shows the responsivity spectrum measured for the second example dual-mode PD in the visible light detection mode, operated under a forward bias of 12 V.
FIG. 11B shows the responsivity spectrum measured for the second example dual-mode PD in the IR light detection mode, operated under a reverse bias of −30 V.
FIG. 11C shows the optical profile of the second example dual-mode PD.
Figures 12A, 12B, 12C:
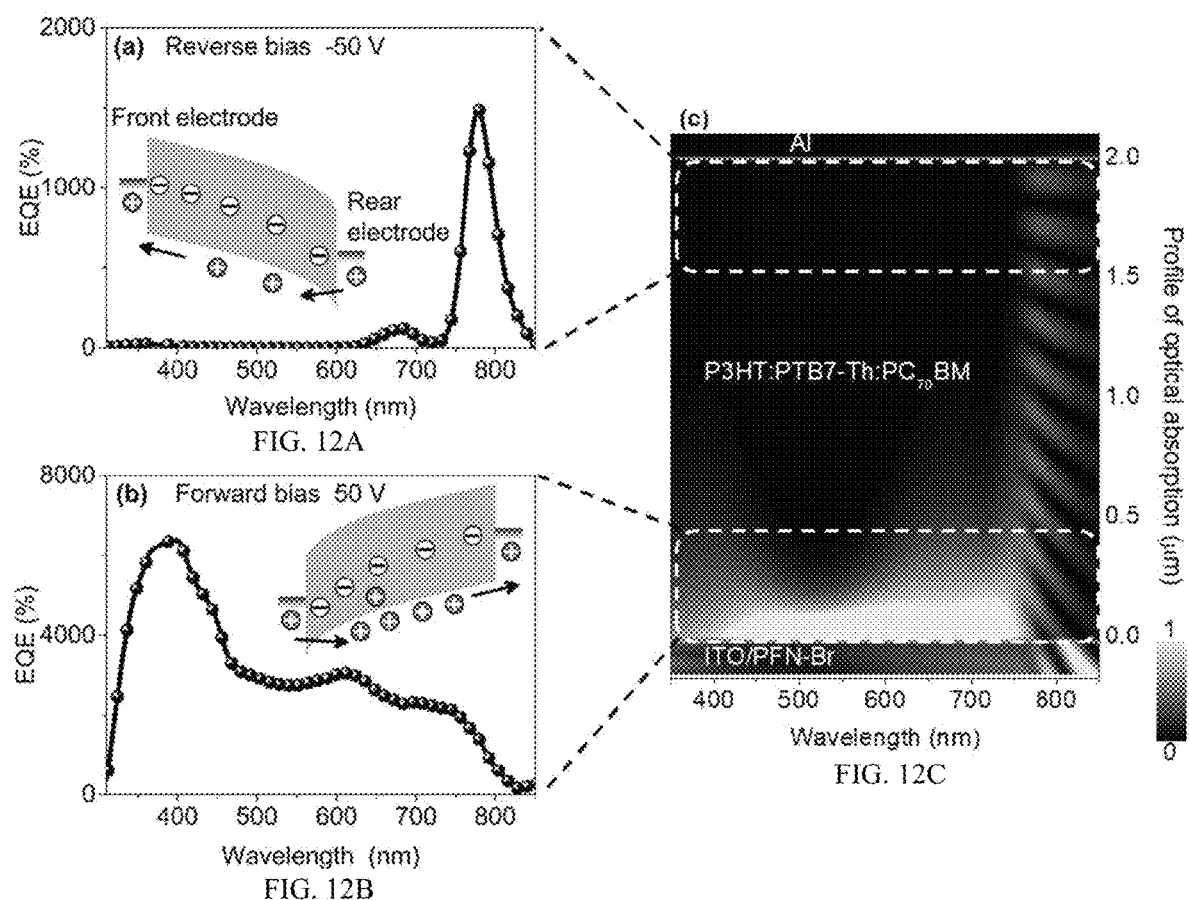
FIG. 12A shows the bias polarity dependent spectral responses of the third example P3HT:PTB7-Th:PC$_{70}$BM (70:30:1) PD with EQE spectrum measured for the ternary PD under a reverse bias of −50 V: the inset therein illustrates the existence of the band bending and tunneling charge injection process at the absorber/rear electrode interface in PD operated under a reverse bias.
FIG. 12B shows the bias polarity dependent spectral responses of the third example of the PD with EQE spectrum measured for the ternary PD under a forward bias of 50 V: the inset therein illustrates the presence of the band bending and tunneling charge injection process at the front electrode/absorber interface in PD operated under a forward bias.
FIG. 12C shows a profile of optical absorption (μm) in terms of distribution of photo-generated charge carriers in a 2000-nm thick ternary P3HT:PTB7-Th:PC$_{70}$BM (70:30:1)-based PD.

The proposed absorber/spacer type multi-mode PDs may also be designed for photodetection in different first-wavelength and second-wavelength electromagnetic waves, using a combination of materials with desired absorption properties. Essentially, the use of an optical spacer in the absorber/spacer type multi-mode PDs enables the second-wavelength and first-wavelength parts of the incident electromagnetic wave being absorbed selectively in the second wavelength and first wavelength absorbing regions. An appropriate optical spacer can be selected to deplete the first wavelength light and enable the second wavelength light reaching to the second wavelength light absorbing layer. Therefore, the absorber/spacer type PD concept described in this invention can be adopted for making different multi-mode PDs. The rapid progresses made in the development of solution-processable functional materials, e.g., organic, polymer, perovskite, colloidal quantum dots, organic/inorganic hybrids, 1D and 2D low dimensional materials and their combinations, offer an attractive option and a variety of material choices for application in different multi-mode PDs, e.g., a visible and SWIR dual-mode PD. It is anticipated that the active materials with well-defined narrow absorption spectrum in the respective first wavelength and second wavelength ranges would be ideal for applications in environmental pollution, bio, medical, agricultural, automotive, fishery, food, wellness and security monitoring, detection and imaging in two or different or multiple distinct bands. In the visible mode, the second example PD is operated under the forward bias, becomes an absorber/spacer configuration, e.g., P3HT:PC$_{70}$BM (100:1) (300 nm)/P3HT:PTB7-Th:PC$_{70}$BM (70:30:1) (500 nm). A visible responsivity of 2.5 A/W was obtained for the PD operated under a forward bias of 12 V, as shown in FIG. 11A. Under a forward bias, the PD has a broadband response behavior over the wavelength range from 300 nm to 650 nm. The optical active layer in the PD, with a configuration of ITO/PFN-Br/spacer/absorber/Al in the IR mode, e.g., a 300-nm thick P3HT:PC$_{70}$BM (100:1) spacer and a 500-nm thick P3HT:PTB7-Th:PC$_{70}$BM (70:30:1) absorber, exhibits high responsivity 4.6 A/W when operated under reverse bias of −30 V as shown in FIG. 11B. The optical profile of the PD over the wavelength range from 300 nm to 850 nm is shown in FIG. 11C. The absorber-1, spacer, absorber-2 layers can also be formed by the same light absorbing materials. An example of multi-mode PD comprises a layer configuration of ITO/PFN-Br/absorber-1/spacer/absorber-2/Al, where the absorber-1 is a 500-nm thick P3HT:PTB7-Th:PC$_{70}$BM (70:30:1) layer, spacer is a 1000-nm thick P3HT:PTB7-Th:PC$_{70}$BM (70:30:1) layer, and absorber-2 a 500-nm thick P3HT:PTB7-Th:PC$_{70}$BM (70:30:1) layer. In this case, the absorber-1, spacer and absorber-2 layers were all formed by P3HT:PTB7-Th:PC$_{70}$BM (70:30:1) blend layer. The ternary blend P3HT:PTB7-Th:PC$_{70}$BM PD has an EQE of >1500%, operated under a reverse bias of −50 V, as shown in FIG. 12A. Under a reverse bias, the PD responses only to the long wavelength light (with a peak wavelength near 780 nm). An EQE of >6000% was obtained for the PD operated under a forward bias of 50 V, as shown in FIG. 12B. Under a forward bias, however, the PD has a broadband response over the wavelength range from 300 nm to 800 nm. Such a bias polarity dependent spectral response of the PD is closely associated with the difference in the wavelength dependent light absorption in the PD.

The depth profile of the wavelength dependent light absorption in the absorber-1 (500 nm-thick P3HT:PTB7-Th: PC$_{70}$BM)/spacer (1000-nm thick P3HT:PTB7-Th: PC$_{70}$BM)/absorber-2 (500-nm thick P3HT:PTB7-Th: PC$_{70}$BM)/-based PD is shown in FIG. 12C. It reveals clearly that the incidence of light with a broad wavelength range from 300 nm to 800 nm is absorbed near the vicinity of the front electrode/absorber-1 interface. Relatively stronger absorption is over the long wavelength ranges, which appears near the absorber-2/rear electrode interface in the PD. The inset in FIG. 12A illustrates the existence of the band bending, induced by the accumulation of the photo-generated charge carriers, due to the absorption of wavelength photons near the vicinity of the absorber-2/rear electrode interface. Therefore, the charge injection process occurs at the absorber-2/rear electrode interface in PD when it is operated under a reverse bias. The inset in FIG. 12B illustrates the presence of the band bending near the vicinity of the front electrode/absorber-1 interface, induced by the accumulation of the photo-generated charge carriers due to the absorption of the broadband photons. This leads to the charge injection process to take place at the front electrode/absorber-1 interface in PD when it is operated under a forward bias.

Figures 13A, 13B, 13C:
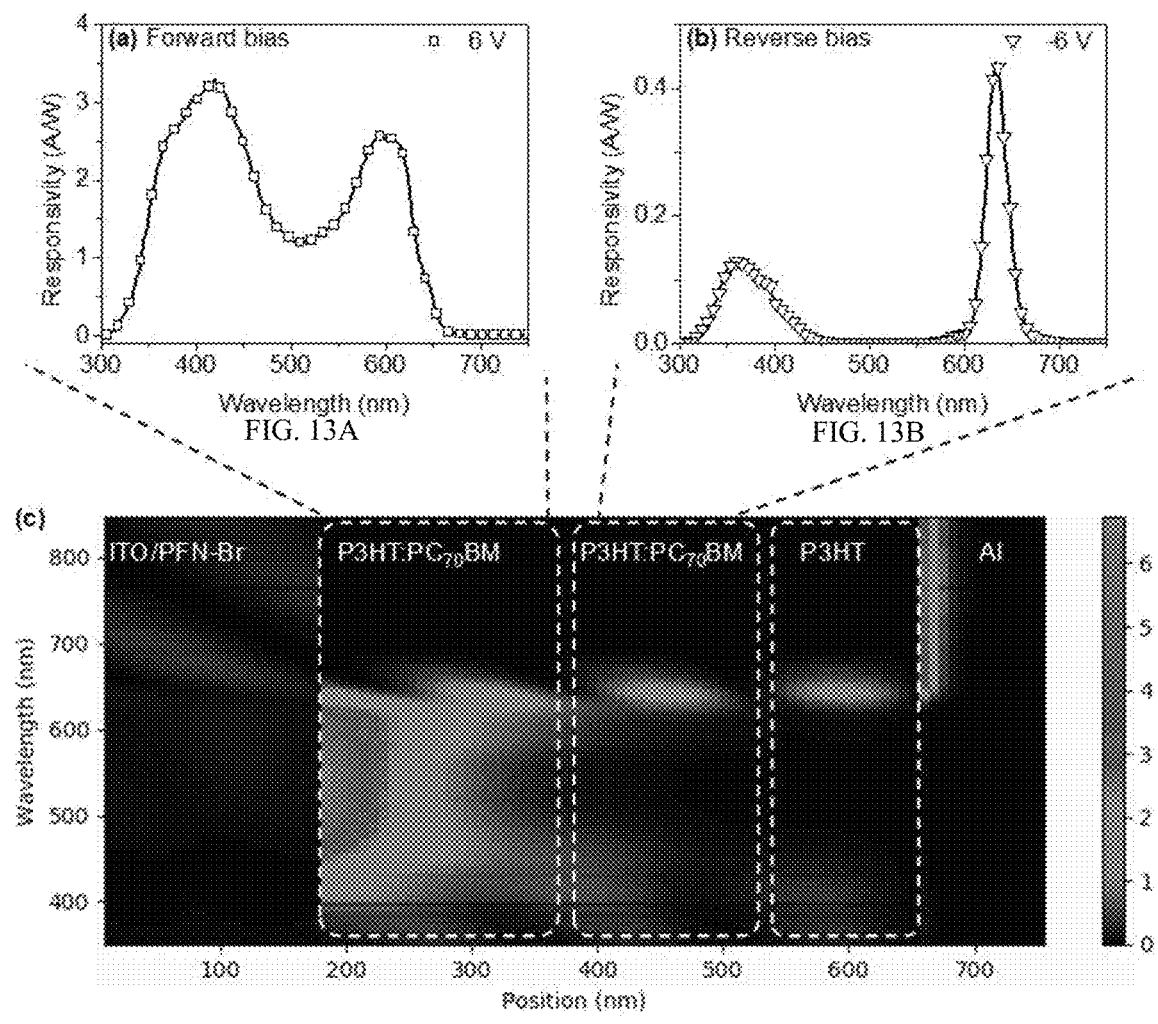
FIG. 13A shows the responsivity spectrum measured for the fourth example PD operated under a forward bias of 6 V.
FIG. 13B shows the responsivity spectrum measured for the fourth example PD operated under a reverse bias of −6 V.
FIG. 13C displays the optical profile of the fourth example PD.
Figure 14A:
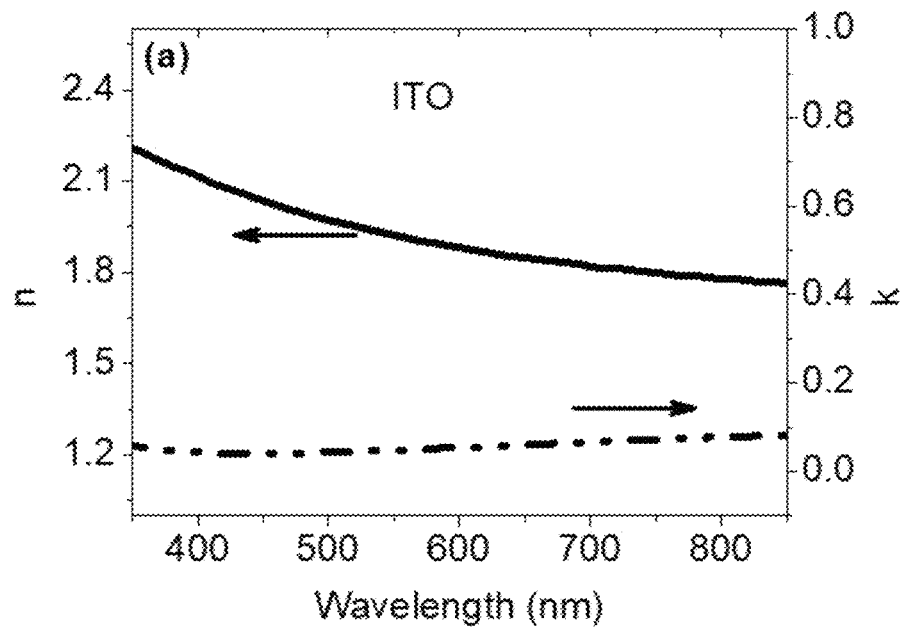
FIG. 14A shows the wavelength dependent refractive index, n(λ), and extinction coefficient, k(λ), of ITO used in the optical simulation in this invention.
Figure 14B:
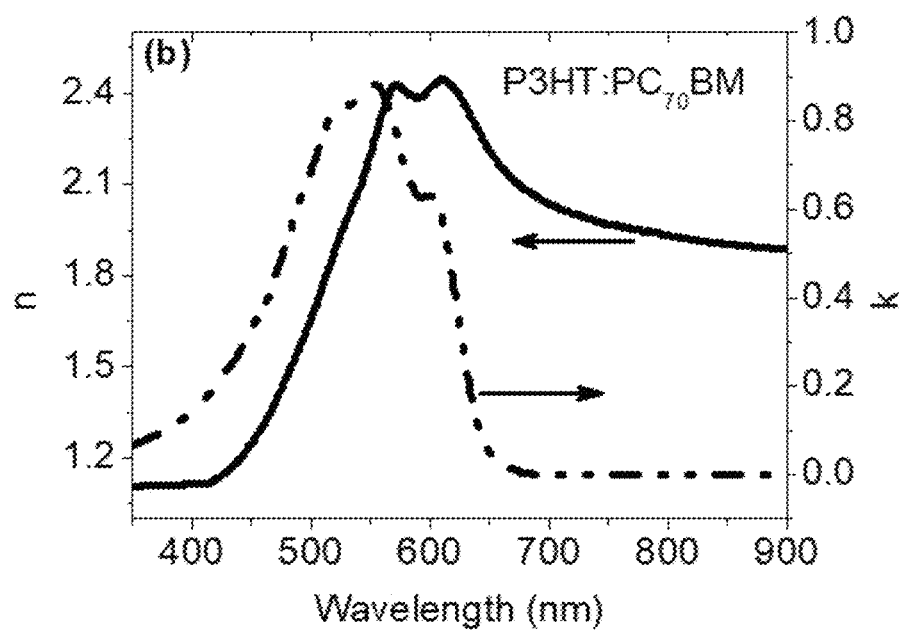
FIG. 14B shows the wavelength dependent refractive index, n(λ), and extinction coefficient, k(λ), of the binary P3HT:PC$_{70}$BM (100:1) blend layers used in the optical simulation in this invention.
Figure 14C:
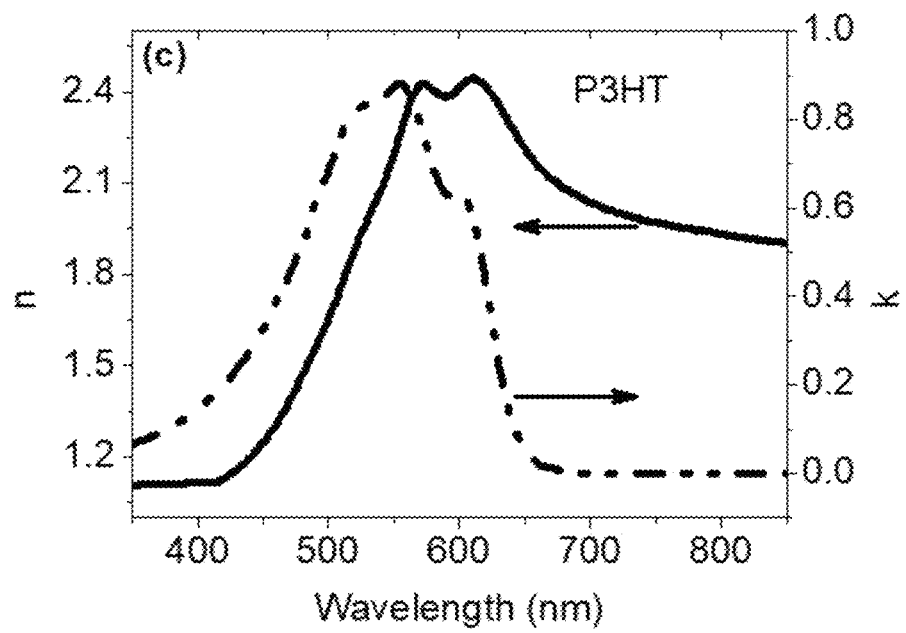
FIG. 14C shows the wavelength dependent refractive index, n(λ), and extinction coefficient, k(λ), of the pristine P3HT layers used in the optical simulation in this invention.
Figure 14D:
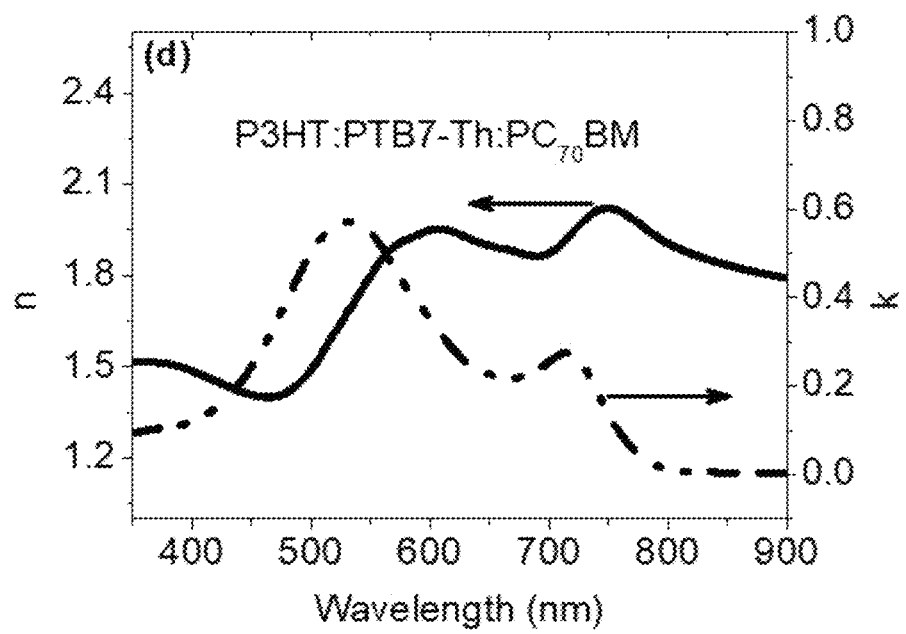
FIG. 14D shows the wavelength dependent refractive index, n(λ), and extinction coefficient, k(λ), of the ternary P3HT:PTB7-Th:PC$_{70}$BM (70:30:1) blend layers used in the optical simulation in this invention.
Figure 14E:
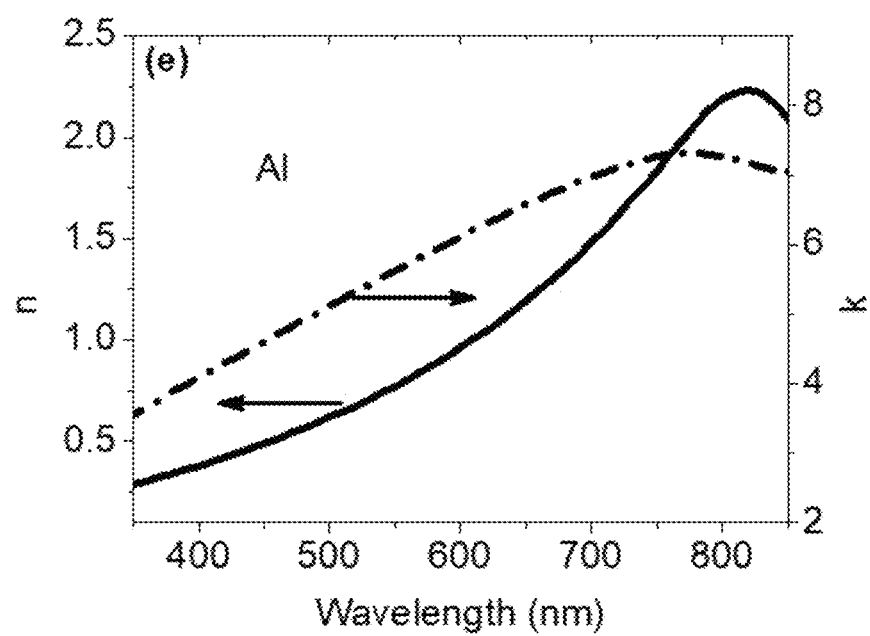
FIG. 14E shows the wavelength dependent refractive index, n(λ), and extinction coefficient, k(λ), of Al used in the optical simulation in this invention.

FIGS. 13A-13B plots the spectral response characteristics of the fourth example PD, with a configuration of ITO/PFN-Br/P3HT:PC$_{70}$BM (100:1) (200 nm)/P3HT:PC$_{70}$BM (100:1) (165 nm)/P3HT (110 nm)/Al. Under the forward bias, P3HT:PC$_{70}$BM (100:1) (200 nm) is the absorber, P3HT:PC$_{70}$BM (100:1) (165 nm)/P3HT (110 nm) acts as the spacer, exhibits a responsivity 3.1 A/W when operated under 6 V as shown in FIG. 13A. Under reverse bias, the active layer in the PD has a layer configuration of spacer-1/absorber/spacer-2. Spacer-1 is P3HT:PC$_{70}$BM (100:1) (200 nm). Absorber is P3HT:PC$_{70}$BM (100:1) (165 nm). Spacer-2 is P3HT (110 nm). Under a reverse bias of −6 V, a narrow band responsivity of 0.41 A/W at the relatively longer wavelength range from 600 nm to 700 nm, as shown in FIG. 13B, was obtained. The optical profile of the spacer-1/absorber/spacer-2 based PD over the wavelength range from 300 nm to 850 nm is shown in FIG. 13C.

The wavelength dependent complex refractive indices used for the calculation of the optical field distributions, as shown in FIGS. 4, 5, 11, 12 and 13, are plotted in FIGS. 14A-14E.

Therefore, it is a great challenge to achieve a bias-switchable spectral response high performance multi-mode PD in different distinct bands. In this invention, the absorber/spacer type multi-mode PD, e.g., a dual-mode PD, comprising a tri-layer configuration of absorber-1 (e.g., visible light absorber)/optical spacer/absorber-2 (e.g., NIR light absorber), has been proposed. Such an absorber/spacer type PD gives rise to the remarkable dual-mode light detection phenomena, exhibiting an IR response operated under a reverse bias and a visible response under a forward bias. The dual-mode PD comprises of a solution-processed 300-nm thick binary blend P3HT:PC$_{70}$BM (100:1) visible light absorbing layer, a 320-nm thick pristine P3HT optical spacer layer and a 500-nm thick ternary blend P3HT:PTB7-Th: PC$_{70}$BM (70:30:1) NIR light absorbing layer. The bias-switchable IR and visible light responses in the dual-mode PD are closely associated with two factors: (1) different distributions of the photo-generated charge carriers in the presence of the IR and visible light, and (2) the bias polarity dependent charge injection behaviors. In the presence of NIR light, the charge injection occurs at the IR light absorber/rear electrode interface in the PD operated under a reverse bias. In the presence of visible light, the charge injection takes place at the front electrode/visible light absorber interface in the PD under a forward bias, due to the high density of visible light-generated charge carriers.

High performance multi-mode PDs are an attractive alternative optical detection technology to the conventional single-mode PDs. They offer additional advantages such as having a bias-switchable spectral response for applications in environmental pollution, bio, medical, agricultural, automotive, fishery, food, wellness and security monitoring, detection and imaging in two or different or multiple distinct bands. The solution-processable fabrication processes also lead to significant cost benefits, thereby creating next-generation large-area and flexible PDs. The unique multi-mode light response properties disclosed in this invention offer an attractive option for new PD concept and applications.

INDUSTRIAL APPLICATION

The present invention relates to a bias-switchable spectral response high performance PD with multi-mode detection, e.g., dual-mode photoresponses in the electromagnetic waves of the second wavelength (e.g., IR) and the first wavelength (e.g., visible light). A bias-switchable spectral response PD can be used for applications in environmental pollution, bio, medical, agricultural, automotive, fishery, food, wellness and security monitoring, detection and imaging in two or different or multiple distinct bands.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

The invention claimed is:
1. A multi-mode photodetector comprising a functional multi-layered structure, the functional multi-layered structure comprising at least one absorber and at least one spacer, said at least one absorber and said at least one spacer being made of the same material or different materials, said multi-mode photodetector being configured to be non-responsive to electromagnetic wave of a first wavelength or visible light while being responsive to electromagnetic wave of a second wavelength or infrared or near infrared operated under a reverse bias, or be non-responsive to the electromagnetic wave of the second wavelength or infrared or near infrared while being responsive to the electromagnetic wave the first wavelength or visible light operated under a forward bias,
   wherein the wavelength of the electromagnetic wave of the first wavelength absorbed by a first absorber of the at least one absorber is shorter than the wavelength of the electromagnetic wave of a second wavelength absorbed by a second absorber of the at least one absorber in the functional multi-layered structure of the first absorber, the at least one spacer and the second absorber, and
   wherein the at least one spacer is light-absorbing so as to effectively deplete the electromagnetic wave of the first wavelength and allow the electromagnetic wave of the second wavelength to be absorbed in the second absorber.

2. The multi-mode photodetector of claim 1, wherein the functional multi-layered structure is a combination of the absorber and the spacer, or a combination of the spacer and the absorber, or a combination of the first absorber, the spacer and the second absorber, or a combination of a first spacer, the absorber and a second spacer, or any combination of the at least one absorber and the at least one spacer.

3. The multi-mode photodetector of claim 1, wherein the same or different materials for the at least one absorber and the at least one spacer is/are one or more of organic, polymer, perovskite, colloidal quantum dots, organic/inorganic hybrids, 1D and 2D low dimensional materials, or any combination thereof.

4. The multi-mode photodetector of claim 1, wherein the first absorber is positioned adjacent to a front electrode of the multi-mode photodetector and is sensitive to the electromagnetic wave of the first wavelength comprising visible light.

5. The multi-mode photodetector of claim 4, wherein the first absorber is made of a material comprising poly (3-hexylthiophene) and $PC_{70}BM$ in a weight ratio of 100:1.

6. The multi-mode photodetector of claim 1, wherein the second absorber is positioned adjacent to a rear electrode of the multi-mode photodetector and is sensitive to the electromagnetic wave of the second wavelength comprising infrared and near infrared light.

7. The multi-mode photodetector of claim 6, wherein the second absorber is made of a material comprising poly (3-hexylthiophene), poly[4,8-bis(5-(2-ethylhexyl)thiophen-2-yl)benzo[1,2-b;4,5-b']dithioph-ene-2,6-diyl-alt-(4-(2-ethylhexyl)-3-fluorothieno[3,4-b]thiophene-)-2-carboxylate-2-6-diyl], and [6,6]-phenyl-C70-butyric-acid-methyl-ester in a weight ratio of 70:30:1.

8. The multi-mode photodetector of claim 1, wherein the at least one spacer is made of poly (3-hexylthiophene) for depleting the electromagnetic wave in visible light range.

9. The multi-mode photodetector of claim 1, wherein the wavelength of the electromagnetic wave of the second wavelength is in a range from 640 nm to 800 nm.

10. The multi-mode photodetector of claim 1, wherein the wavelength of the electromagnetic wave of the first wavelength is in a range from 310 nm to 650 nm.

11. The multi-mode photodetector of claim 1, wherein the photodetector having different photoresponses to electromagnetic wave of different wavelengths operated under a forward or reverse bias is provided by photo-generated charge carriers in respective layers of the multi-mode photodetector.

12. The multi-mode photodetector of claim 5, wherein the first absorber has a thickness from 10 nm to 10 microns.

13. The multi-mode photodetector of claim 7, wherein the second absorber has a thickness from 10 nm to 10 microns.

14. The multi-mode photodetector of claim 8, wherein the at least one spacer has a thickness from 10 nm to 10 microns and the poly (3-hexylthiophene) is pristine poly (3-hexylthiophene).

15. A bias-controllable spectral response multi-mode photodetector comprising the multi-mode photodetector of claim 1 and two different electrodes, wherein polarity of biases applied to the two different electrodes of the multi-mode photodetector is adjusted in order to provide bias-controllable spectral response to electromagnetic wave of different wavelengths.

16. The bias-controllable spectral response multi-mode photodetector of claim 15, wherein the bias-controllable spectral response multi-mode photodetector is used for imaging, environmental pollution, bio, medical, agricultural, automotive, fishery, food, wellness and security monitoring and detection, and optical communications in two or multiple distinct bands.

17. The bias-controllable spectral response multi-mode photodetector of claim 16, wherein the two or multiple distinct bands comprise a plurality of electromagnetic waves with two or more different wavelengths ranging from 10 nm to 1000 μm.

18. The bias-controllable spectral response multi-mode photodetector of claim 17, wherein the plurality of electromagnetic waves with two or more different wavelengths are selected from UV, visible, NIR, SWIR, MWIR, LWIR and VLWIR.

* * * * *